(12) United States Patent
Lin et al.

(10) Patent No.: US 7,642,137 B2
(45) Date of Patent: Jan. 5, 2010

(54) MANUFACTURING METHOD OF CHIP PACKAGE

(75) Inventors: Chun-Ying Lin, Tainan County (TW); Ya-Chi Chen, Tainan County (TW); Yu-Ren Chen, Tainan County (TW); I-Hsin Mao, Tainan County (TW)

(73) Assignee: ChipMOS Technologies Inc., Hsinchi (TW)

( * ) Notice: Subject to any disclaimer, the term of this patent is extended or adjusted under 35 U.S.C. 154(b) by 169 days.

(21) Appl. No.: 11/746,654

(22) Filed: May 10, 2007

(65) Prior Publication Data
US 2008/0157333 A1 Jul. 3, 2008

(30) Foreign Application Priority Data
Jan. 3, 2007 (TW) ............................... 96100225 A

(51) Int. Cl.
*H01L 21/44* (2006.01)
(52) U.S. Cl. ........................ 438/127; 438/26; 438/64; 438/118; 438/124
(58) Field of Classification Search .................. 257/98, 257/99, 100, 678, 680, 690, 706; 438/25, 438/26, 64, 65, 66, 107, 110, 112, 113, 118, 438/119, 121–127
See application file for complete search history.

(56) References Cited

U.S. PATENT DOCUMENTS

| | | | | |
|---|---|---|---|---|
| 6,614,103 | B1 * | 9/2003 | Durocher et al. | 257/678 |
| 6,949,772 | B2 * | 9/2005 | Shimizu et al. | 257/99 |
| 7,417,220 | B2 * | 8/2008 | Suehiro et al. | 250/239 |
| 2004/0046242 | A1 * | 3/2004 | Asakawa | 257/678 |
| 2006/0166477 | A1 * | 7/2006 | Wang et al. | 438/598 |
| 2007/0096272 | A1 * | 5/2007 | Wang | 257/675 |
| 2007/0202623 | A1 * | 8/2007 | Gao et al. | 438/29 |

* cited by examiner

*Primary Examiner*—Kevin M Picardat
(74) *Attorney, Agent, or Firm*—Jianq Chyun IP Office

(57) ABSTRACT

A chip package including a thermal enhanced plate, contacts around the thermal enhanced plate and electrically insulated from the thermal enhanced plate, a film-like circuit layer disposed on the contacts and the thermal enhanced plate, a conductive adhesive layer, a first molding, and at least one chip disposed on the film-like circuit layer is provided. The conductive adhesive layer is disposed between the contacts and the film-like circuit layer electrically connected to the contacts through the conductive adhesive layer. The chip has a back surface, an active surface and many bumps disposed thereon, and the chip is electrically connected to the film-like circuit layer via the bumps. The first molding at least encapsulates a portion of the thermal enhanced plate, the conductive adhesive layer, parts of the contacts and at least a portion of the film-like circuit layer. Therefore, heat dissipation efficiency of the light emitting chip package is improved.

7 Claims, 24 Drawing Sheets

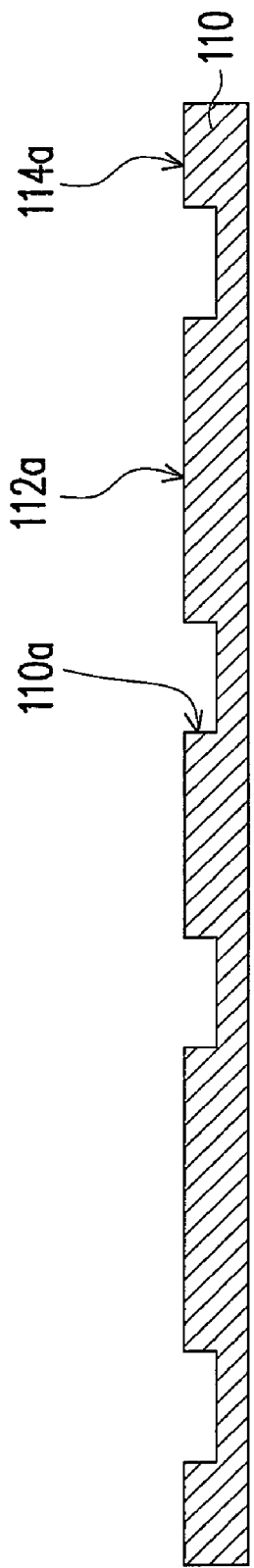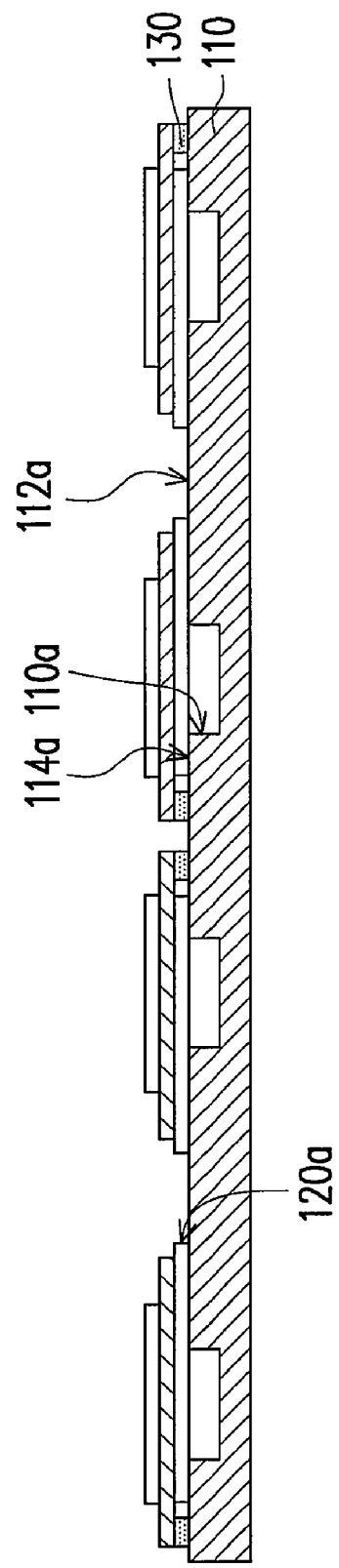

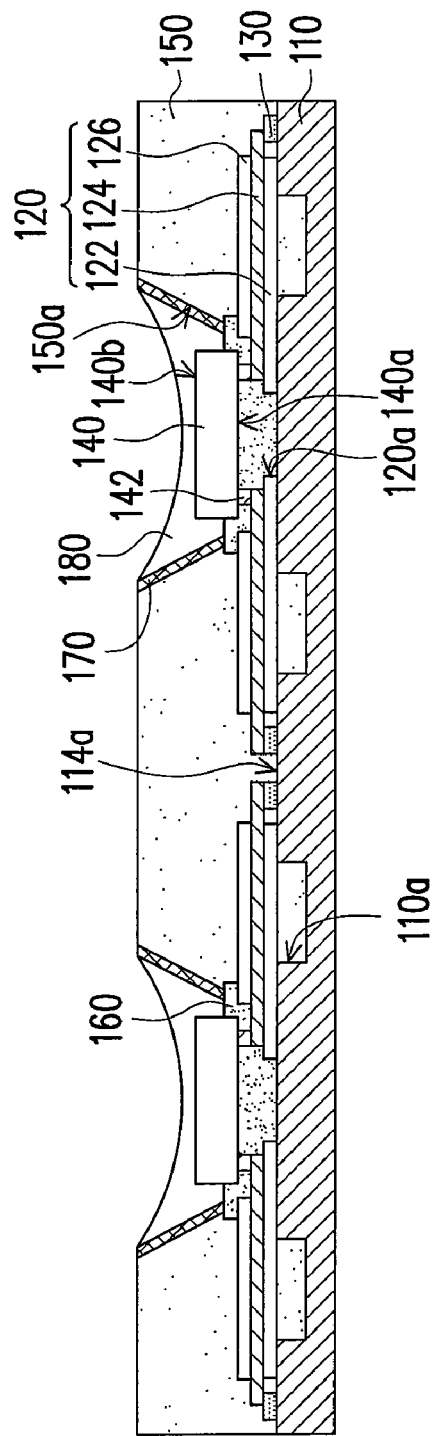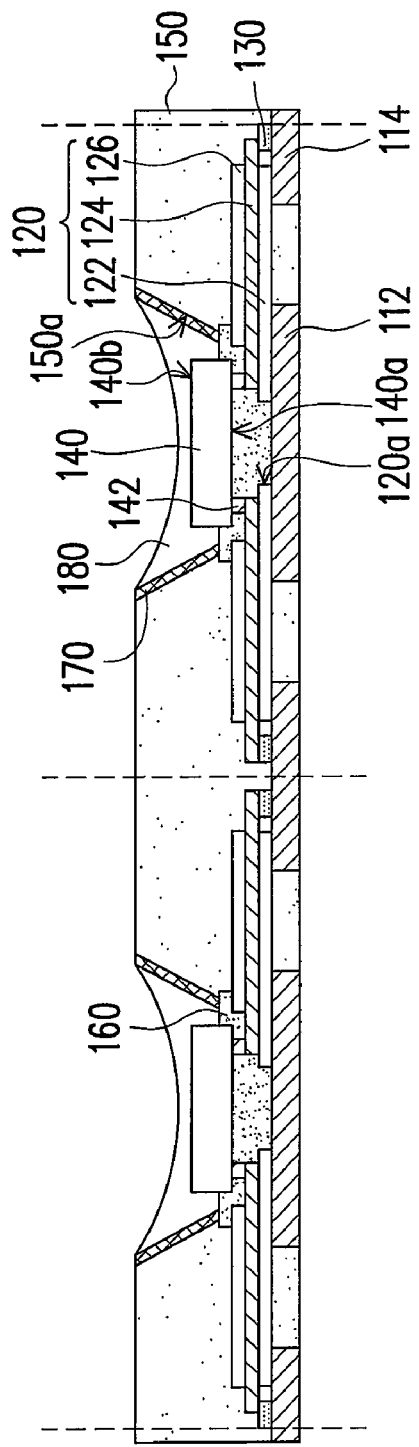

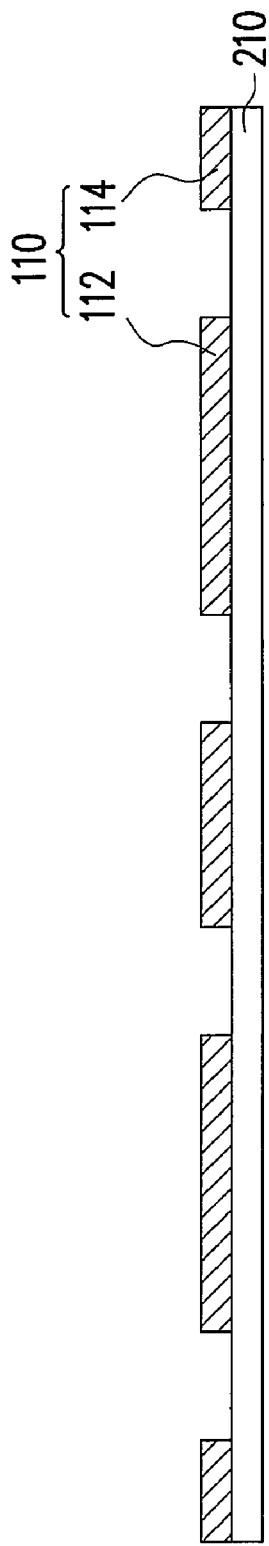
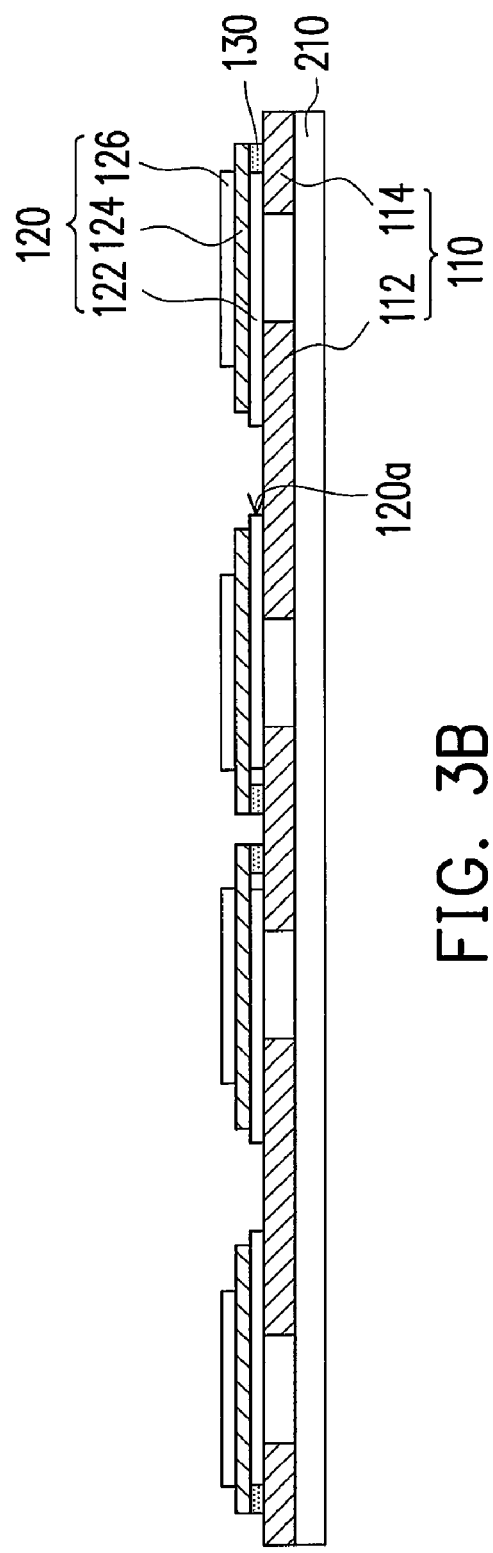

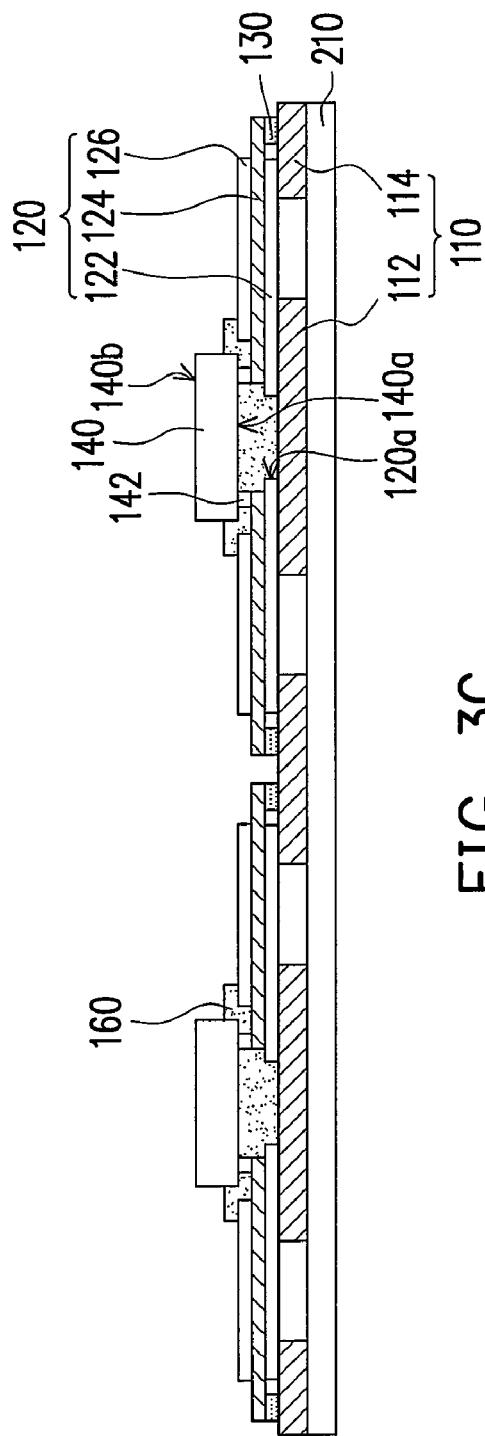
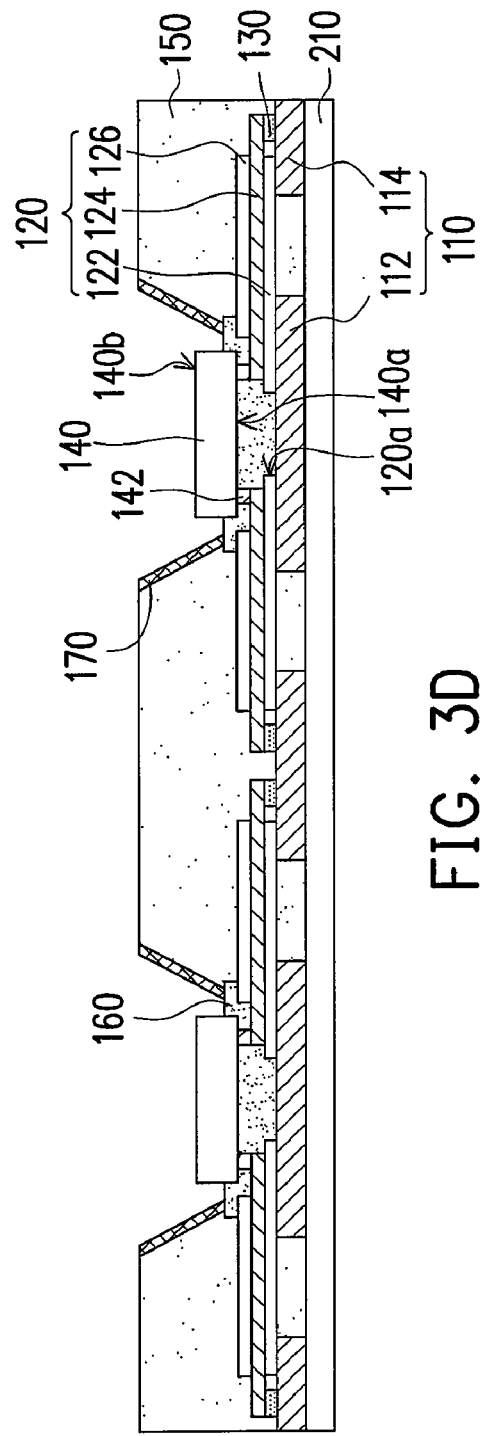

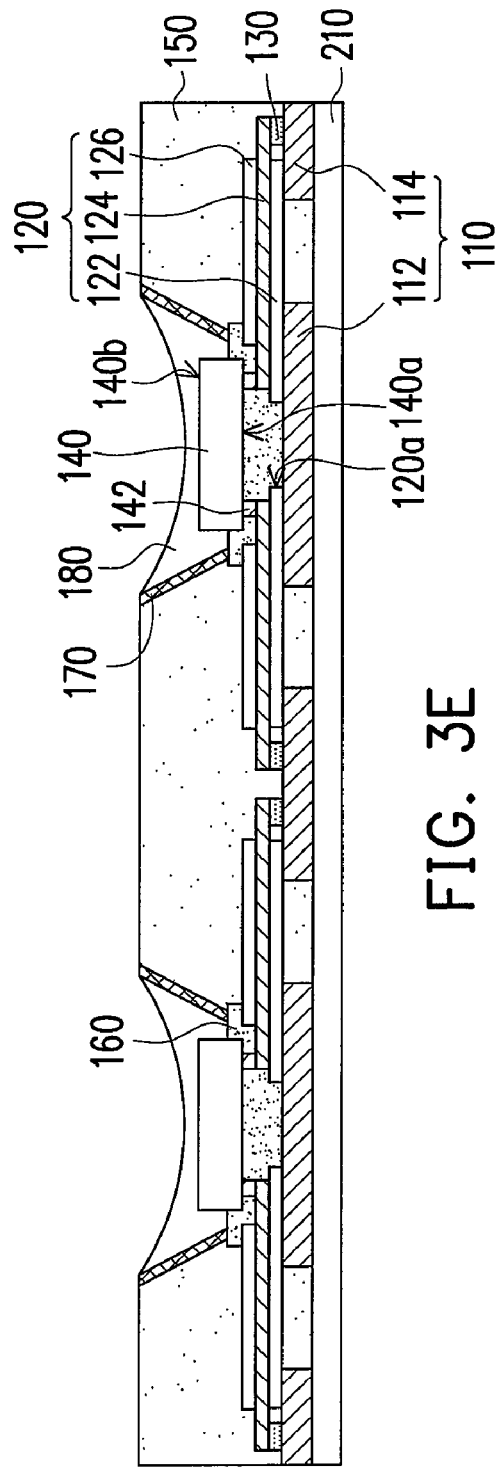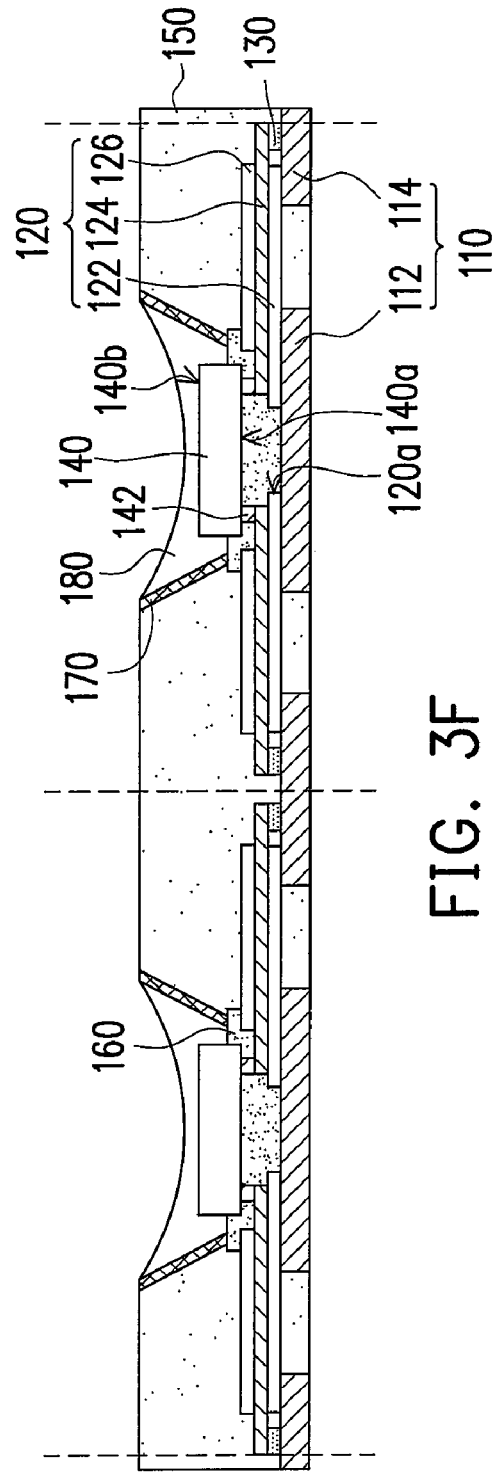

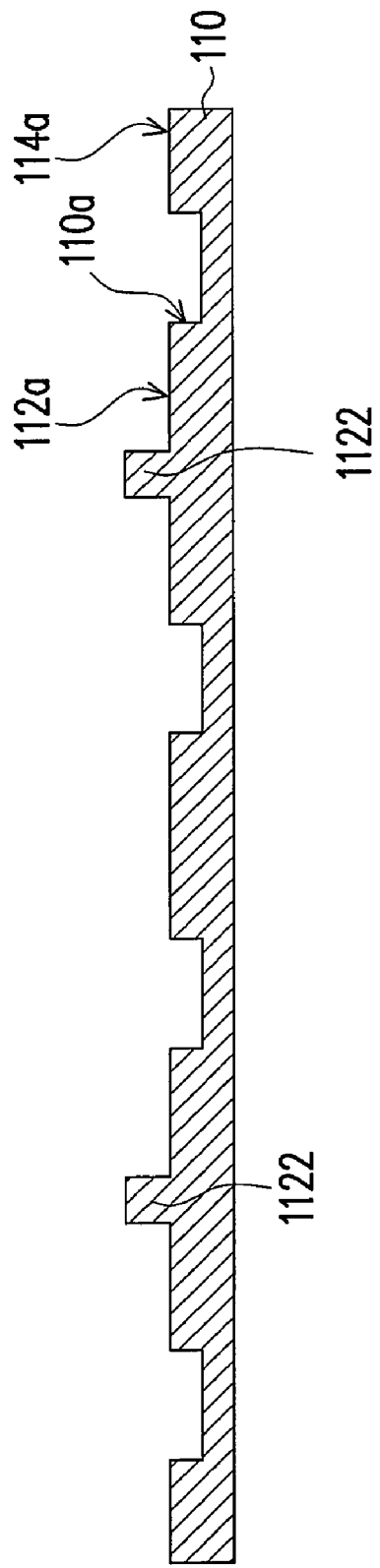
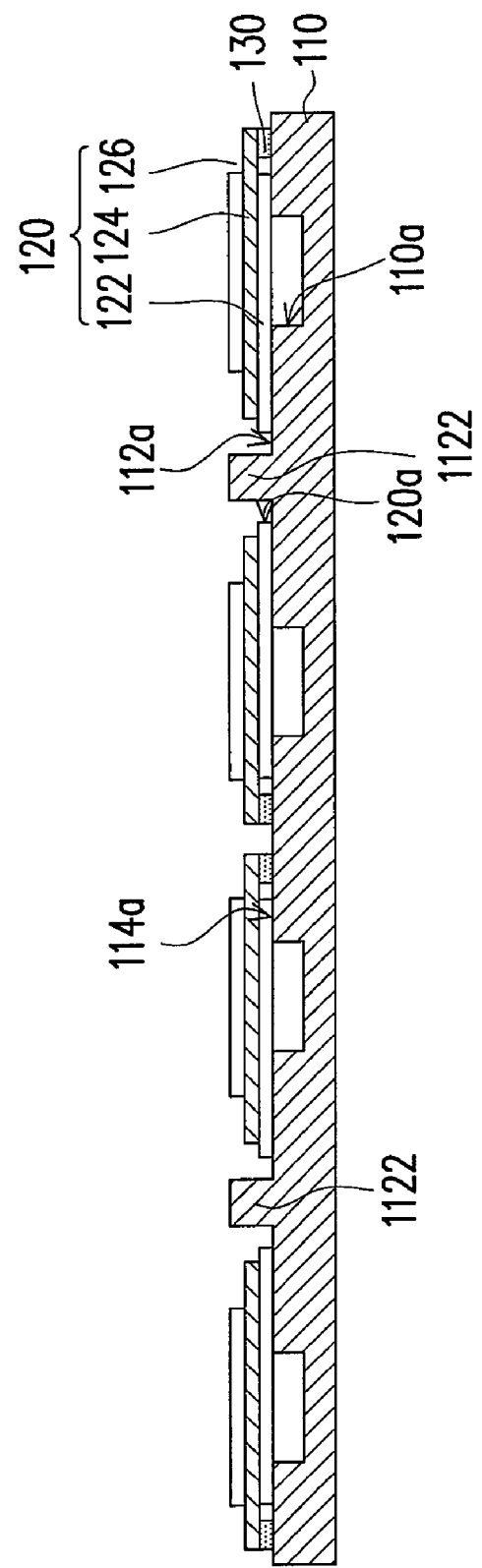
FIG. 5A
FIG. 5B

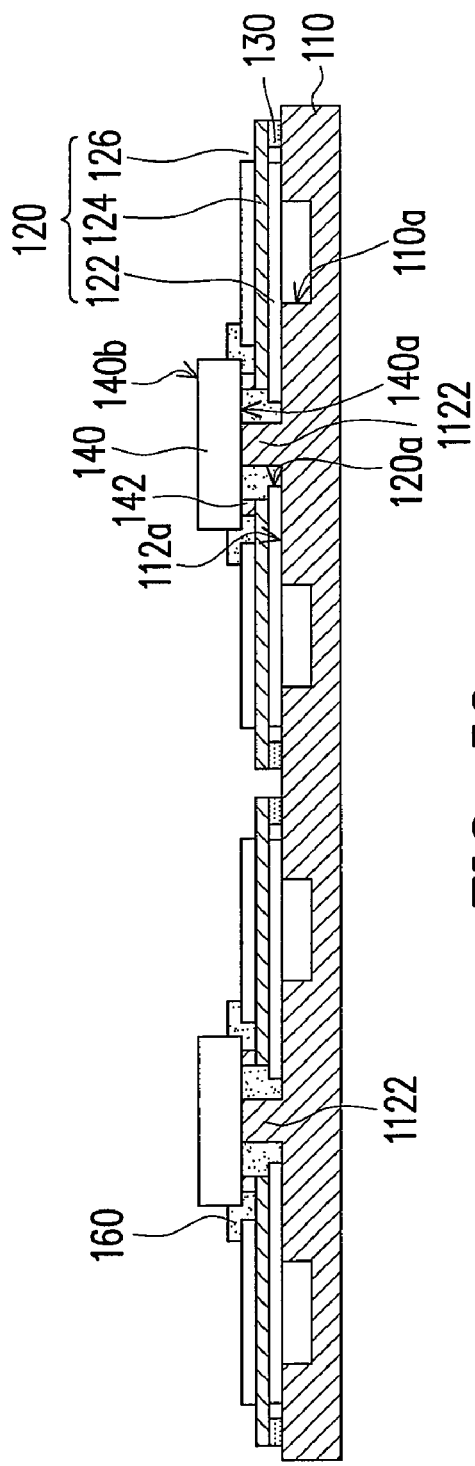
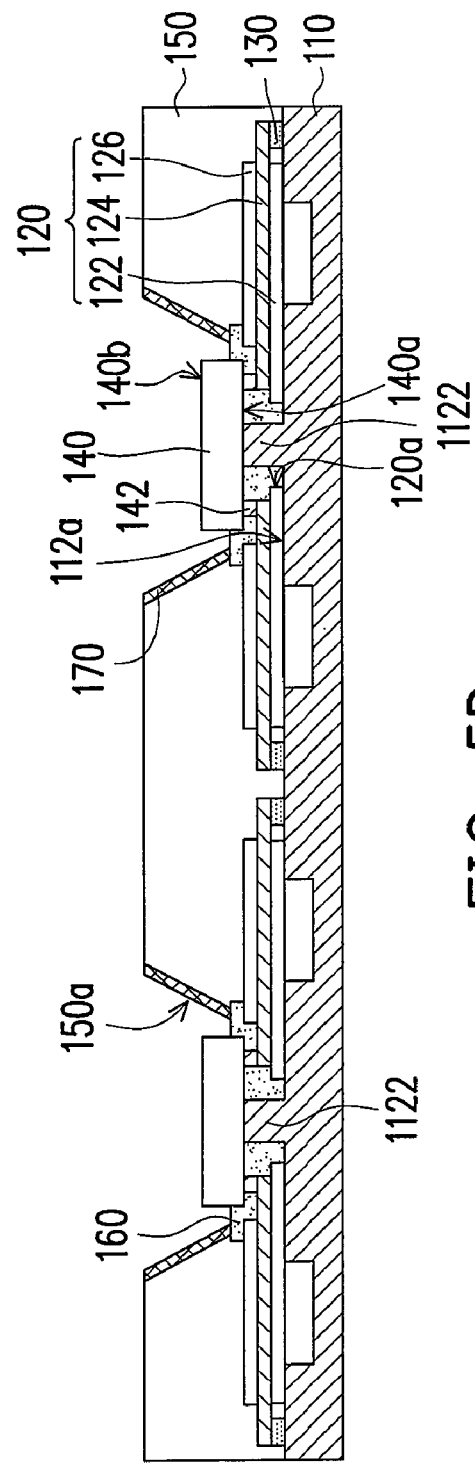

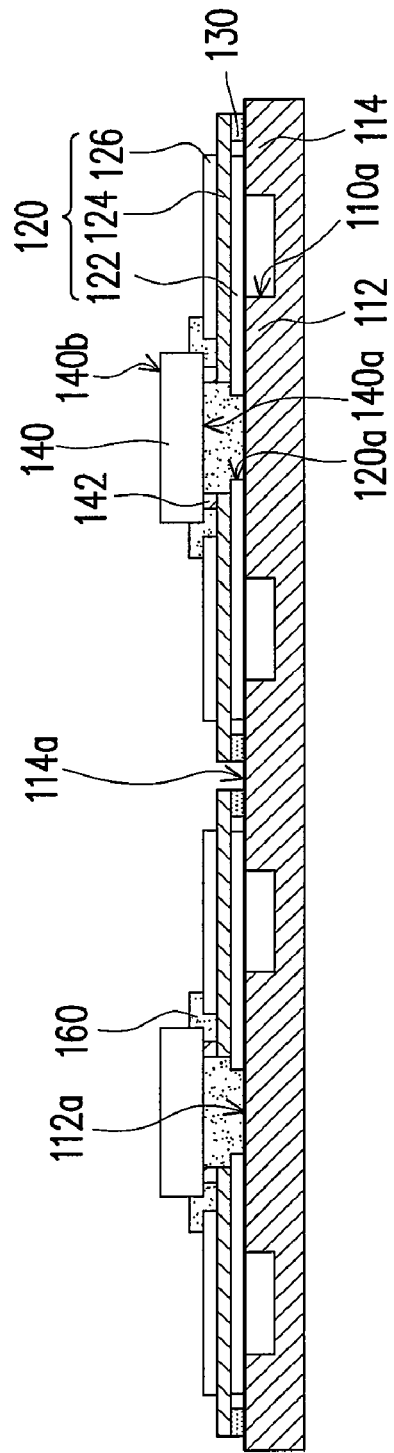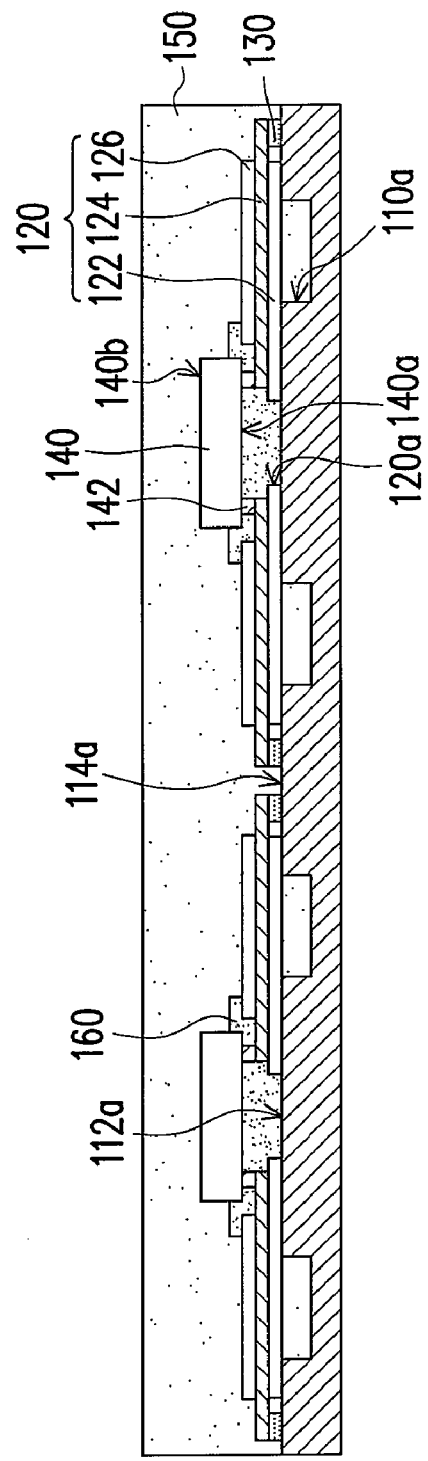

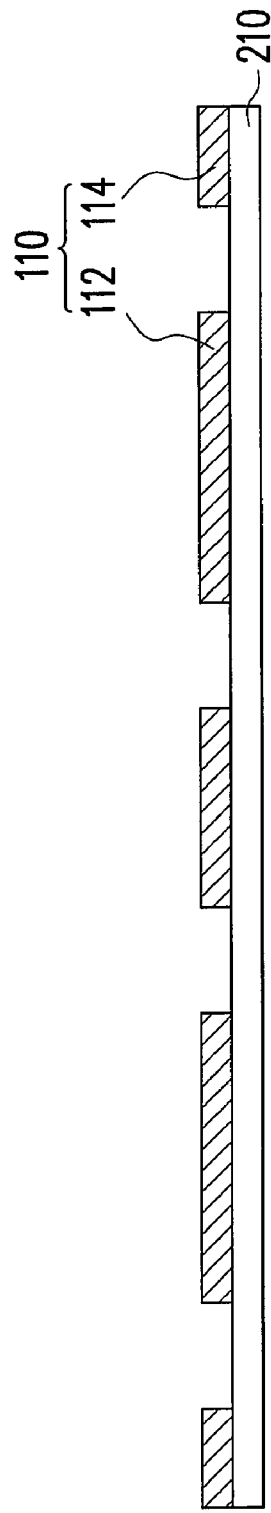
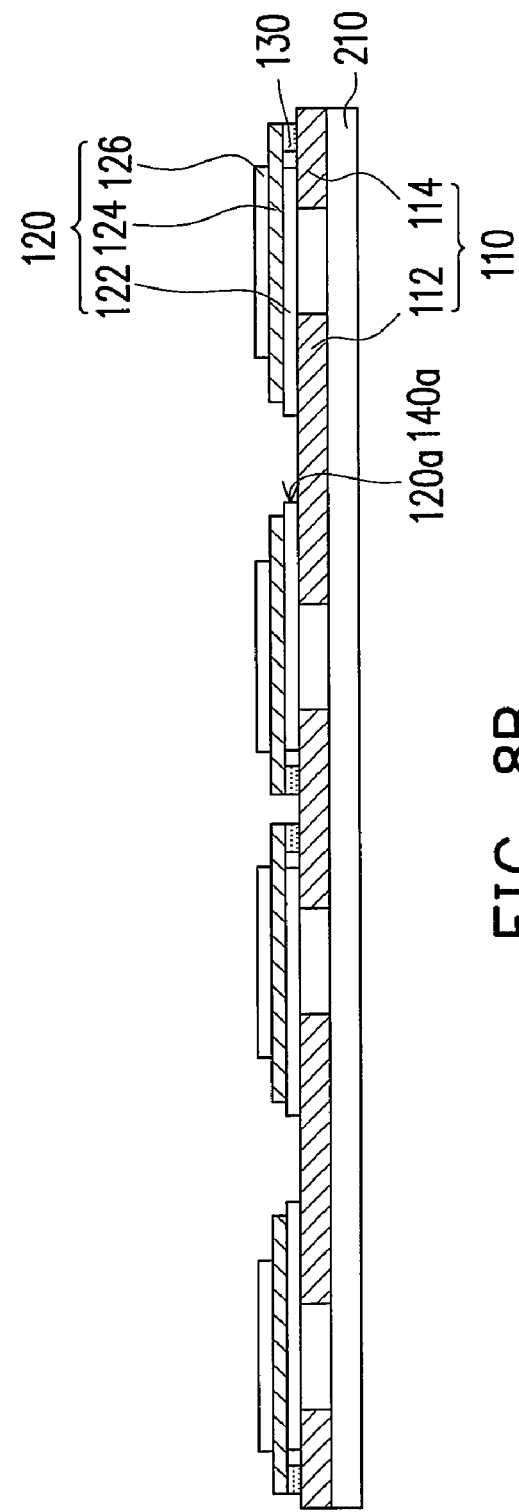

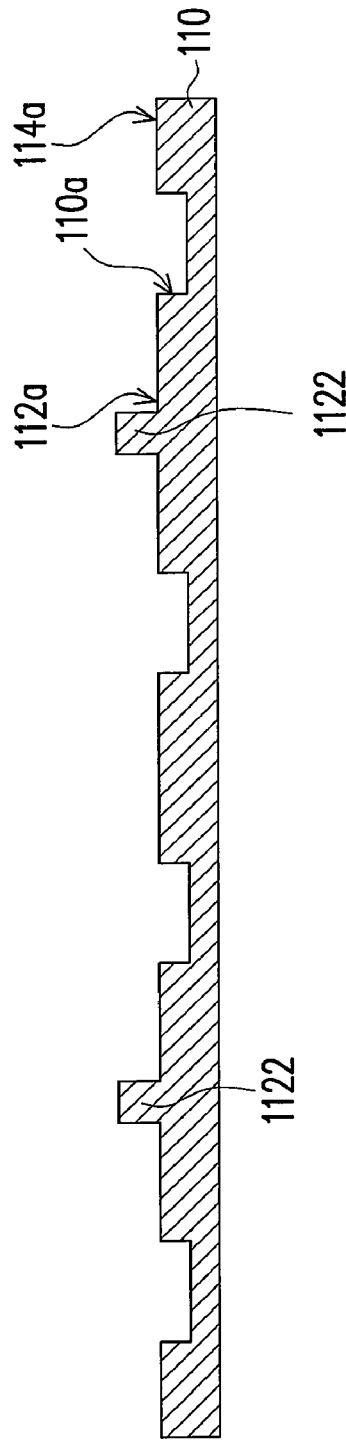
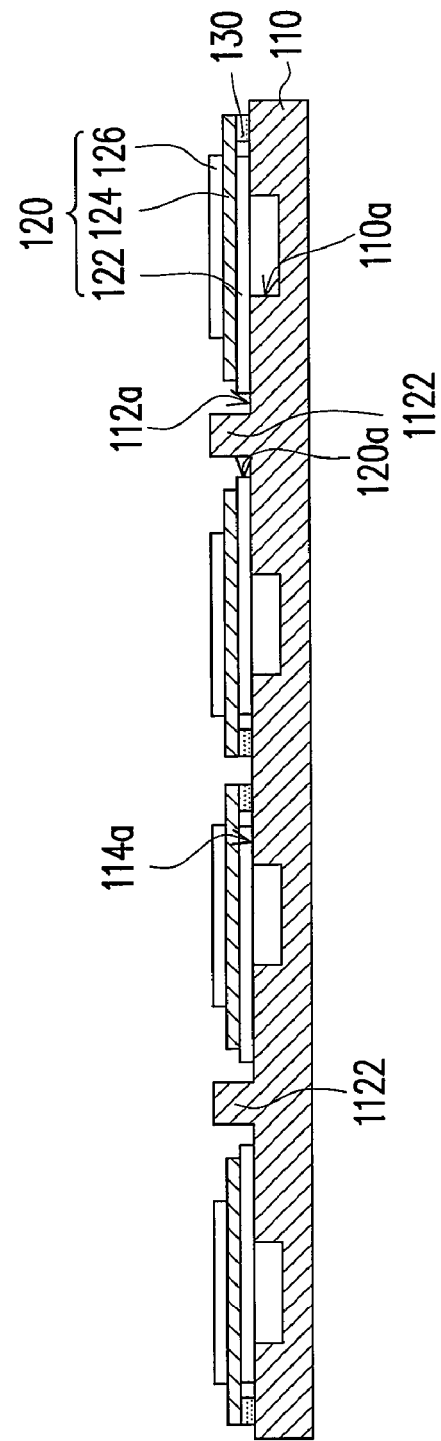

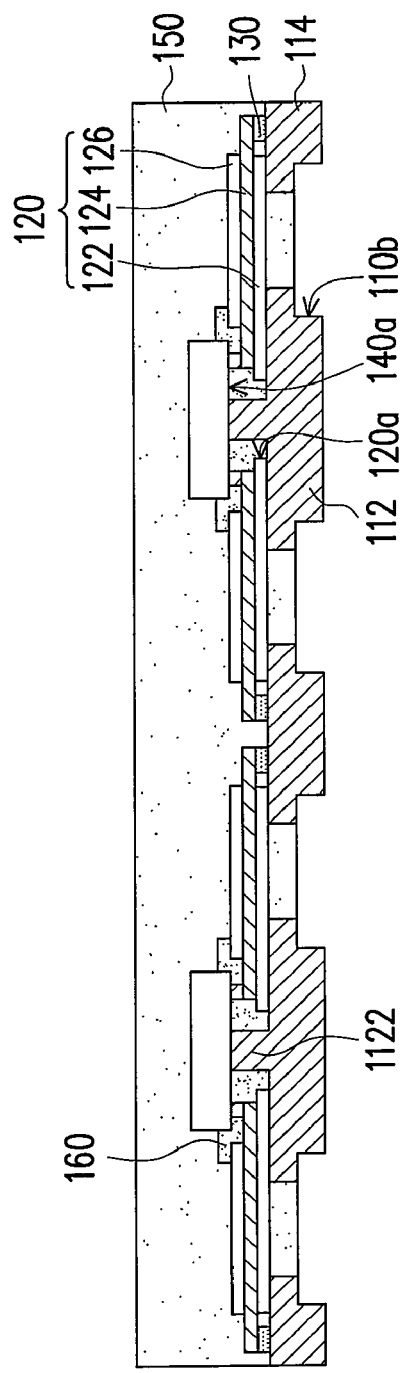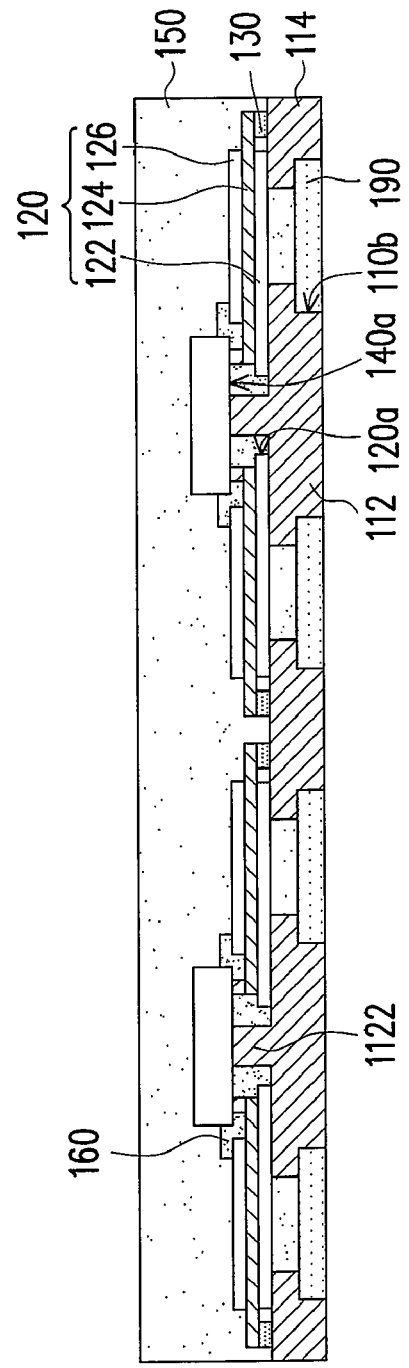

MANUFACTURING METHOD OF CHIP PACKAGE

CROSS-REFERENCE TO RELATED APPLICATION

This application claims the priority benefit of Taiwan application serial no. 96100225, filed Jan. 3, 2007. All disclosure of the Taiwan application is incorporated herein by reference.

BACKGROUND OF THE INVENTION

1. Field of the Invention

The present invention relates to a semiconductor device, and more particularly to a chip package.

2. Description of Related Art

In the recent years, light emitting diode (LED) devices adopting GaN-containing compound semiconductors such as GaN, AlGaN, InGaN, etc are rather prominent. The III nitride materials have a broad band-gap, and a light wavelength thereof includes almost all wavebands of visible lights, such as an ultraviolet light, a red light, and so on. Moreover, in comparison with conventional bulbs, the LEDs have absolute attributes. For example, an LED is physically compact, long lasting, low voltage/current driven, durable, mercury free (pollution free), highly emissive (power saving), and so forth. Therefore, the LEDs can be applied in a wide variety of fields.

Because the light emitted from the LED is a type of cold emission rather than a thermal emission or an electric discharge, the service life of an LED device often exceeds a hundred thousand hours, and no idling time is required. In addition, the LED devices have advantages of high responsive speed (about $10^{-9}$ seconds) on the premise of efficient heat dissipation, small volume, little consumption of electricity, low degree of pollution (no mercury contained), great reliability, adaptation of mass production, and so on. Thus, the applications of the LEDs are quite extensive, and the LEDs are deemed the most important light sources in the $21^{st}$ century.

However, a great deal of heat may be generated during the operation of the LEDs, and the luminance and the working life of the LEDs are both subject to temperature changes. Accordingly, with the increase in the light emitting efficiency of the LEDs, demands for better heat dissipation are raised. Conventionally, complicated heat dissipation systems are utilized according to the related art, which results in an excessive volume of the device and higher manufacturing costs.

SUMMARY OF THE INVENTION

In view of the foregoing, the present invention is directed to a manufacturing method of a chip package to simplify the manufacturing process.

The present invention is further directed to a chip package for enhancing the efficiency of heat dissipation.

The present invention provides a chip package including a thermal enhanced plate, a plurality of contacts, a film-like circuit layer, a conductive adhesive layer, a first molding, and at least a chip. The contacts are around the thermal enhanced plate. The film-like circuit layer is disposed on the contacts and the thermal enhanced plate and is electrically insulated from the thermal enhanced plate. The conductive adhesive layer is disposed between the film-like circuit layer and the contacts, and the film-like circuit layer and the contacts are electrically connected through the conductive adhesive layer. The chip is disposed on the film-like circuit layer, and the chip has an active surface, a back surface, and a plurality of bumps. The bumps are disposed on the active surface, and the chip is electrically connected to the film-like circuit layer via the bumps. The first molding at least encapsulates a portion of the thermal enhanced plate, the conductive adhesive layer, parts of the contacts and at least a portion of the film-like circuit layer.

According to one embodiment of the present invention, the first molding further has a first opening exposing a portion of the film-like circuit layer on which the chip is disposed, and the chip is a light emitting chip.

According to one embodiment of the present invention, the chip package further includes an underfill sandwiched between the chip and the film-like circuit layer to encapsulate the bumps, and the underfill exposes the back surface of the chip.

According to one embodiment of the present invention, the chip package further includes a second molding disposed within the first opening to encapsulate the chip and the underfill.

According to one embodiment of the present invention, the chip package further includes a second molding disposed within the first opening to encapsulate the chip.

According to one embodiment of the present invention, the first molding encapsulates the chip.

According to one embodiment of the present invention, the first molding is formed by a transparent material.

According to one embodiment of the present invention, the chip includes a memory chip.

According to one embodiment of the present invention, a material of the conductive adhesive layer includes solder, silver paste, anisotropic conductive paste, anisotropic conductive film, or conductive B-stage adhesive.

According to one embodiment of the present invention, the film-like circuit layer includes a flexible substrate, a patterned metal layer and a solder mask layer. The patterned metal layer is disposed on the flexible substrate, while the solder mask layer is disposed on the patterned metal layer.

According to one embodiment of the present invention, the film-like circuit layer has a second opening disposed below the chip, and the second opening exposes a portion of the thermal enhanced plate.

According to one embodiment of the present invention, the thermal enhanced plate has a protrusion passing through the second opening and bonding the chip.

According to one embodiment of the present invention, the chip package further includes a third molding sandwiched between the contacts and the thermal enhanced plate and disposed below the first molding.

The invention further provides a manufacturing method of a chip package. The manufacturing method includes the following steps. First, a patterned metal plate having at least a heat dissipation portion, a plurality of contacting portions, and a plurality of recesses is provided. The recesses separate the heat dissipation portion from the contacting portions, and the heat dissipation portion is disposed among the contacting portions. Next, a conductive adhesive layer is formed on the contacting portions. Thereafter, the patterned metal plate is bonded to a film-like circuit layer. The film-like circuit layer is electrically connected to the contacting portions through the conductive adhesive layer. After that, at least a chip is disposed on the film-like circuit layer. The chip has a plurality of bumps, and the chip and the film-like circuit layer are electrically connected through the bumps. A first molding is then formed on the patterned metal plate to encapsulate at least a portion of the film-like circuit layer, and the first molding fills the recesses. Afterwards, a portion of the patterned metal plate is removed to expose the first molding in the recesses and to form at least a thermal enhanced plate and a plurality of contacts separated therefrom. Eternally, a cutting process is performed to form at least a chip package.

According to one embodiment of the present invention, the first molding encapsulates the chip in the step of forming the first molding.

According to one embodiment of the present invention, the first molding has a first opening exposing the chip in the step of forming the first molding.

The invention further provides a manufacturing method of a chip package. The manufacturing method includes the following steps. First, a patterned metal plate is bonded to a substrate. The patterned metal plate includes at least a thermal enhanced plate and a plurality of contacts around the thermal enhanced plate. Next, a conductive adhesive layer is formed on the contacts. Thereafter, the patterned metal plate is bonded to a film-like circuit layer. The film-like circuit layer is electrically connected to the contacts through the conductive adhesive layer. After that, at least a chip is disposed on the film-like circuit layer. The chip has a plurality of bumps, and the chip and the film-like circuit layer are electrically connected through the bumps. A first molding is then formed on the patterned metal plate to encapsulate at least a portion of the film-like circuit layer, a portion of the thermal enhanced plate and parts of the contacts. Next, the substrate is removed. Eternally, a cutting process is performed to form at least a chip package.

According to one embodiment of the present invention, the first molding encapsulates the chip in the step of forming the first molding.

According to one embodiment of the present invention, the first molding has a first opening exposing the chip in the step of forming the first molding.

According to one embodiment of the present invention, the manufacturing method of the chip package further includes forming a second molding on the film-like circuit layer exposed by the first molding to encapsulate the chip after the chip is disposed.

Based on the above, the film-like circuit layer and the metal plate are bonded to carry the chip according to the present invention. Therefore, the chip package of the present invention has better heat dissipation efficiency and a longer service life. In addition, the chip package has the exposed contacts to facilitate the assembly of the chip package to other electronic devices.

In order to the make the aforementioned and other objects, features and advantages of the present invention comprehensible, several embodiments accompanied with figures are described in detail below.

BRIEF DESCRIPTION OF THE DRAWINGS

FIGS. 2A through 2F are cross-sectional schematic views showing a manufacturing method of the chip package according to the first embodiment of the present invention.

FIGS. 3A through 3F are cross-sectional schematic views showing another manufacturing method of the chip package according to the first embodiment of the present invention.

FIGS. 5A through 5G are cross-sectional schematic views showing a manufacturing method of the chip package according to the second embodiment of the present invention.

FIGS. 7A through 7E are cross-sectional schematic views showing a manufacturing method of the chip package according to the third embodiment of the present invention.

FIGS. 8A through 8E are cross-sectional schematic views showing another manufacturing method of the chip package according to the third embodiment of the present invention.

FIGS. 10A through 10G are cross-sectional schematic views showing a manufacturing method of the chip package according to the fourth embodiment of the present invention.

DESCRIPTION OF EMBODIMENTS

First Embodiment

Figure 1:
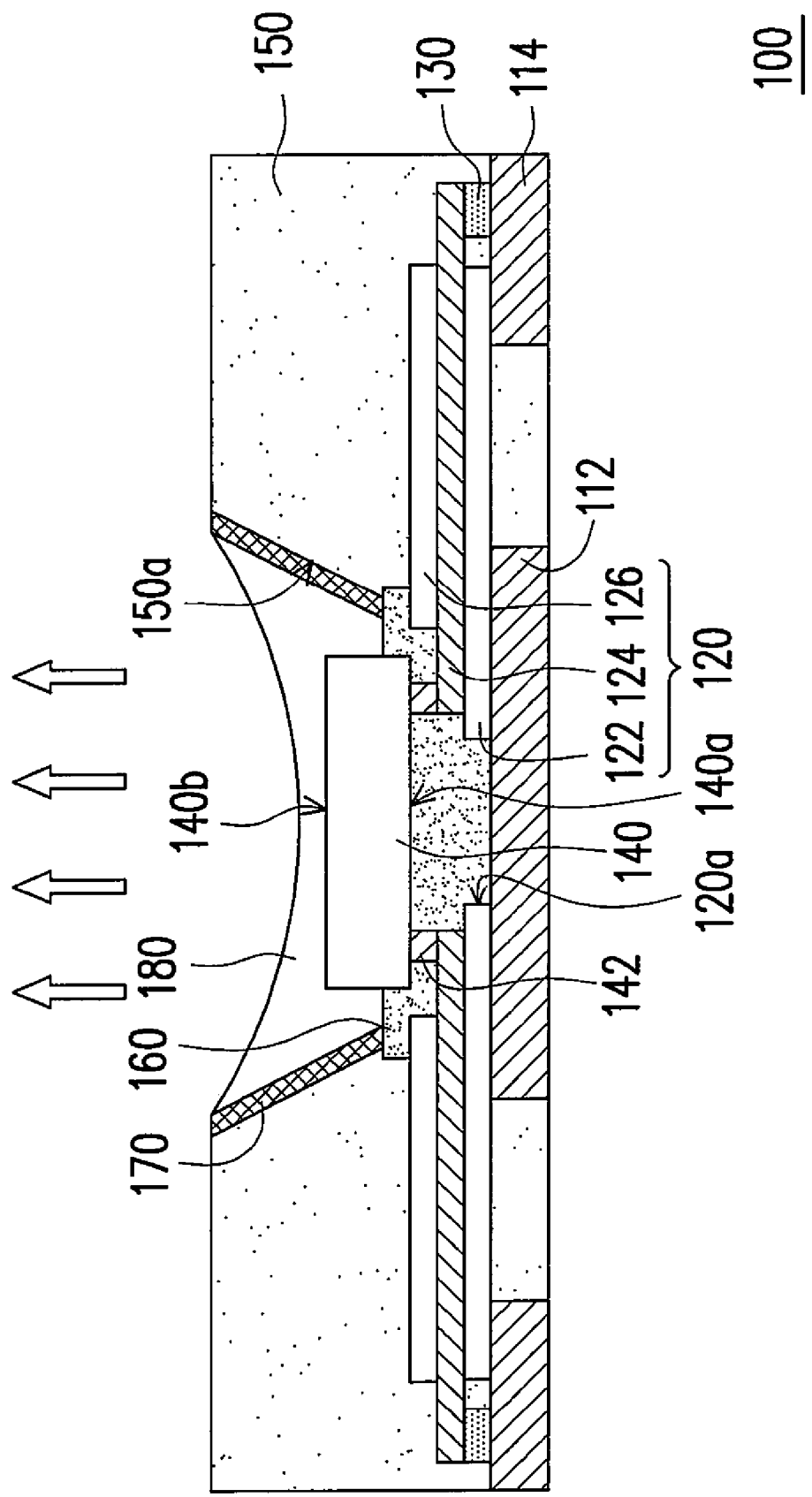
FIG. 1 is a cross-sectional view of a chip package according to a first embodiment of the present invention.

FIG. 1 is a cross-sectional view of a chip package according to a first embodiment of the present invention. Referring to FIG. 1, the chip package 100 of the present embodiment includes a thermal enhanced plate 112, a plurality of contacts 114, a film-like circuit layer 120, a conductive adhesive layer 130, a first molding 150 and at least a chip 140. The contacts 114 are around the thermal enhanced plate 112. In addition, the film-like circuit layer 120 is disposed on the thermal enhanced plate 112 and the contacts 114 and is electrically insulated from the thermal enhanced plate 112. For example, the film-like circuit layer 120 may be bonded to the thermal enhanced plate 112 through an insulating adhesive layer (not shown), and the film-like circuit layer 120 can be electrically insulated from the thermal enhanced plate 112. The conductive adhesive layer 130 is disposed between the film-like circuit layer 120 and the contacts 114, and the film-like circuit layer 120 and the contacts 114 are electrically connected through the conductive adhesive layer 130. The first molding 150 encapsulates a portion of the thermal enhanced plate 114, the conductive adhesive layer 130, parts of the contacts 114 and a portion of the film-like circuit layer 120. Besides, the first molding 150 has a first opening 150a exposing a portion of the film-like circuit layer 120. The chip 140 is disposed on the film-like circuit layer 120 exposed by the first opening 150a, and the chip 140 has an active surface 140a, a back surface 140b, and a plurality of bumps 142. The bumps 142 are disposed on the active surface 140a, and the chip 140 is electrically connected to the film-like circuit layer 120 via the bumps 142. It should be noted that the first molding 150 may completely encapsulate the chip 140 as well, and the relevant description are elaborated hereinafter.

More specifically, referring to FIG. 1 again, the thermal enhanced plate 112 may be co-planar with the contacts 114, and the thermal enhanced plate 112 and the contacts 114 are made of the same material. For example, the material of the contacts 114 and the thermal enhanced plate 112 may be copper, aluminum, or any other metal with high coefficient of thermal conductivity, and thus heat generated by the chip 140 can be rapidly conducted to the outside through the contacts 114 and the thermal enhanced plate 112. On the other hand, the film-like circuit layer 120 includes a flexible substrate 122, a patterned metal layer 124 and a solder mask layer 126. The patterned metal layer 124 is disposed on the flexible substrate 122, and the solder mask layer 126 is disposed on the patterned metal layer 124. However, it is not limited in the present embodiment that the film-like circuit layer 120 merely has a single-layered circuit. Namely, the film-like circuit layer 120 may have a multi-layered circuit.

Additionally, to enhance heat dissipation efficiency, the film-like circuit layer 120 may have a second opening 120a disposed below the chip 140, and the second opening 120a exposes a portion of the thermal enhanced plate 112. Besides, the material of the conductive adhesive layer 130 may be solder, silver paste, anisotropic conductive paste, anisotropic conductive film, conductive B-stage adhesive or any other conductive material. Accordingly, the film-like circuit layer 120 can be mounted to the contacts 114 via the conductive adhesive layer 130, and the film-like circuit layer 120 can be electrically connected to the contacts 114. Moreover, the chip 140 may be a light emitting diode (LED), an organic light emitting diode (OLED) or any other type of light emitting chip.

To improve the luminance of the chip package 100, a width of the first opening 150a may be gradually increased in a direction away from the film-like circuit layer 120. And the chip package 100 may further include a reflective layer 170 disposed on an inner wall of the first opening 150a of the first molding 150 for an improvement in luminance efficiency. In the present embodiment, an edge of the first molding 150 may be aligned with the edges of the contacts 114. Besides, to protect the electrical connection between the bumps 142 and the film-like circuit layer 120, the chip package 100 of the present embodiment may further include an underfill 160 disposed between the chip 140 and the film-like circuit layer 120 to encapsulate the bumps 142 and to expose the back surface 140b of the chip 140. Furthermore, the chip package 100 may also include a second molding 180 disposed within the first opening 150a to encapsulate the chip 140 and the underfill 160, and the second molding 180 is formed by a transparent material. However, in another embodiment, the chip package 100 may merely have the second molding 180 to protect the electrical connection between the bumps 142 and the film-like circuit layer 120. Moreover, to improve the luminance, the second molding 180 may include a fluorescent powder.

In the chip package 100 of the present embodiment, the film-like circuit layer 120 is mounted to the thermal enhanced plate 112 to replace the conventional circuit plate. Thus, in comparison with the chip package provided by the related art, the chip package 100 of the present embodiment has better heat dissipation efficiency and a longer service life. Two manufacturing methods of the chip package 100 will be described in detail as follows.

Figure 2C:
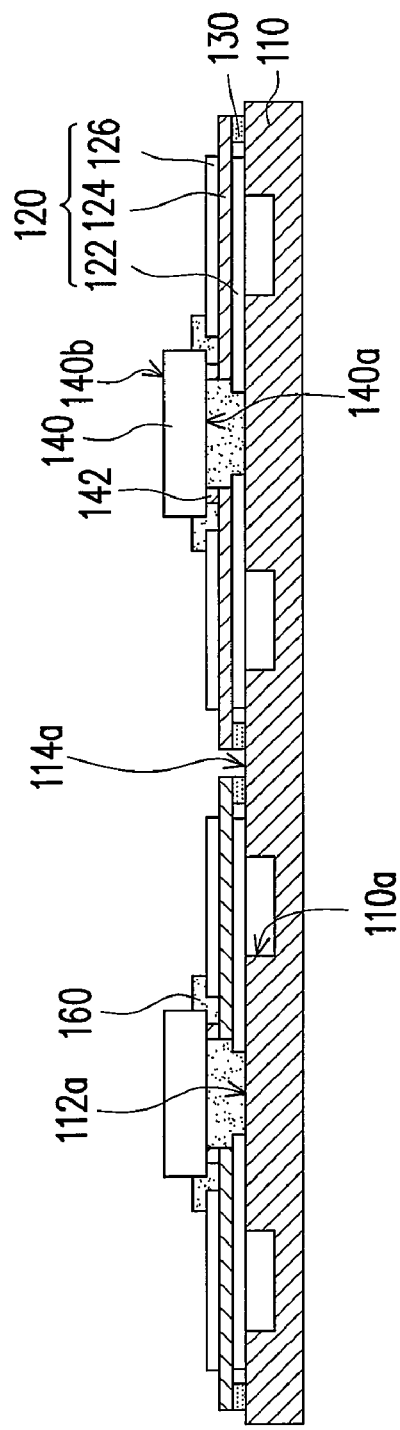

FIGS. 2A through 2F are cross-sectional schematic views showing a manufacturing method of the chip package according to the first embodiment of the present invention. Referring to FIG. 2A, the manufacturing method of the chip package in the present embodiment includes the following steps. First, a patterned metal plate 110 having at least a heat dissipation portion 112a, a plurality of contacting portions 114a, and a plurality of recesses 110a is provided. The recesses 110a separate the heat dissipation portion 112a from the contacting portions 114a around the heat dissipation portion 112a. More particularly, a metal plate (not shown) is provided, and a half-etching process is performed on the metal plate to form the patterned metal plate 110.

Referring to FIG. 2B, a conductive adhesive layer 130 is formed on the contacting portions 114. The conductive adhesive layer 130 is formed by implementing a screen printing method, for example. Next, a film-like circuit layer 120 is provided and bonded to the patterned metal plate 110. The film-like circuit layer 120 is electrically connected to the contacting portions 114a through the conductive adhesive layer 130.

Referring to FIG. 2C, at least a chip 140 is disposed on the film-like circuit layer 120. The chip 140 is electrically connected to the film-like circuit layer 120 via the bumps 142. Thereafter, an underfill 160 is formed between the film-like circuit layer 120 and the chip 140 to encapsulate the bumps 142. However, in another embodiment, the underfill 160 need not be formed.

Figure 2D:
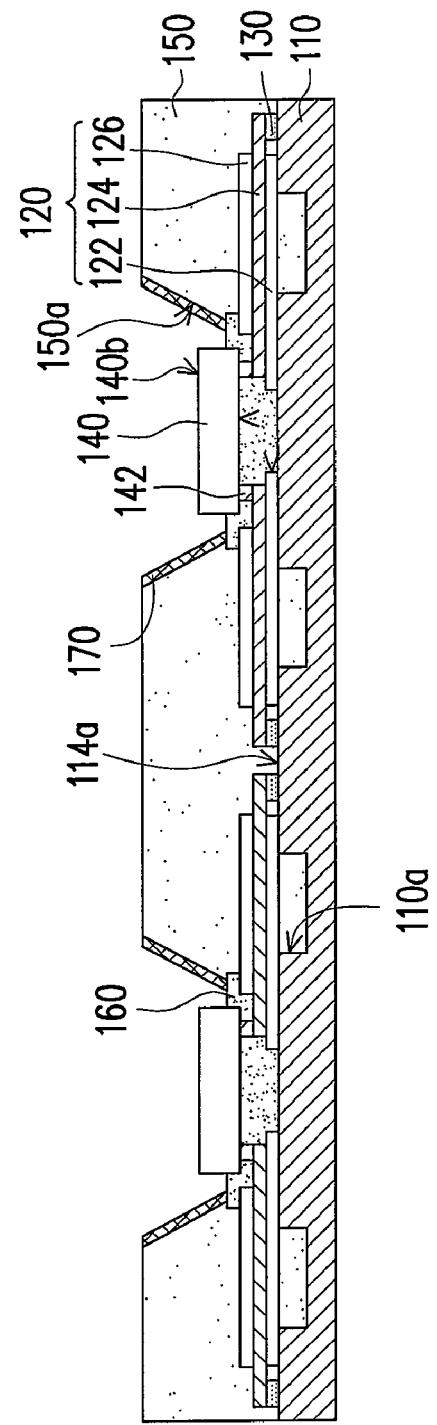

Referring to FIG. 2D, a molding process is carried out to form a first molding 150 on the patterned metal plate 110 to encapsulate at least a portion of the film-like circuit layer 120 and to fill the recesses 110a. In addition, to increase the reflectivity rate of the first molding 150, a reflective layer 170 may also be formed on an inner wall of the first opening 150a of the first molding 150 after the first molding 150 is formed.

Referring to FIG. 2E, after the underfill 160 and the first molding 150 are formed, a second molding 180 is formed on the film-like circuit layer 120 exposed by the first molding 150 to encapsulate the chip 140. Nevertheless, according to another embodiment, a second molding 180 may be directly formed on the film-like circuit layer 120 exposed by the first molding 150, for the underfill 160 is unformed.

Referring to FIGS. 2E and 2F, a portion of the patterned metal plate 110 is removed to expose the first molding 150 in the recesses 110a and to form at least a thermal enhanced plate 112 and a plurality of contacts 114 separated therefrom. In more detail, a portion of a thickness of the patterned metal plate 110 is removed to expose the first molding 150 within the recesses 110a. In other words, the thermal enhanced plate 112 can be completely separated from the contacts 114 to prevent a short circuit from occurring between the thermal enhanced plate 112 and the contacts 114.

Eternally, a cutting process is performed to form at least a chip package 100. Thus far, the fabrication of the chip package 100 is completed. Another manufacturing method of the chip package 100 will be elaborated hereinafter.

FIGS. 3A through 3F are cross-sectional schematic views showing another manufacturing method of the chip package according to the first embodiment of the present invention. Referring to FIG. 3A, the manufacturing method of the chip package in the present embodiment includes the following steps. First, a patterned metal plate 110 is bonded to a substrate 210. The patterned metal plate 110 includes at least a thermal enhanced plate 112 and a plurality of contacts 114 around the thermal enhanced plate 112. In addition, the thermal enhanced plate 112 is separated from the contacts 114. More specifically, a metal plate (not shown) is mounted to the substrate 210, and a photolithography process and an etching process are performed on the metal plate to form the patterned metal plate 110. Here, the photolithography process includes an exposure process and a development process. Besides, the substrate 210 may be a removable temporary carrier, such as a tape or other films which are apt to be separated from the patterned metal plate 110. Moreover, a material of the patterned metal plate 110 may be copper, aluminum, or any other metal with a high coefficient of thermal conductivity.

Referring to FIG. 3B, a conductive adhesive layer 130 is formed on the contacts 114. In addition, the conductive adhesive layer 130 is formed by implementing a screen printing method, for example. Next, a film-like circuit layer 120 is provided and bonded to the patterned metal plate 110. The film-like circuit layer 120 is electrically connected to the contacts 114 through the conductive adhesive layer 130.

Referring to FIG. 3C, at least a chip 140 is disposed on the film-like circuit layer 120. The chip 140 is electrically connected to the film-like circuit layer 120 via the bumps 142. Then, to protect the electrical connection between the bumps 142 and the film-like circuit layer 120, an underfill 160 may be formed between the chip 140 and the film-like circuit layer 120 to encapsulate the bumps 142 after the chip 140 is disposed.

Referring to FIG. 3D, a first molding 150 is formed on the patterned metal plate 110 to encapsulate at least a portion of the film-like circuit layer 120, a portion of the thermal enhanced plate 112 and parts of the contacts 114. In more detail, the first molding 150 is filled into spaces between the thermal enhanced plate 112 and the contacts 114, so as to bond the thermal enhance plate 112 to the contacts 114. In addition, to increase the reflectivity rate of the first molding 150, a reflective layer 170 may also be formed on an inner wall of the first opening 150a of the first molding 150 after the first molding 150 is formed.

Referring to FIG. 3E, after the underfill 160 and the first molding 150 are formed, a second molding 180 is formed on the film-like circuit layer 120 exposed by the first molding 150 to encapsulate the chip 140. Nevertheless, according to another embodiment, a second molding 180 may be directly formed on the film-like circuit layer 120 exposed by the first molding 150, for the underfill 160 is unformed.

Referring to FIGS. 3E and 3F, the substrate 210 is then removed. At last, a cutting process is performed to form at least a chip package 100. Thus far, the fabrication of the chip package 100 is completed. Note that the step of removing the substrate 210 may be carried out any time after the formation of the first molding 150 and before the implementation of the cutting process.

Second Embodiment

Figure 4:
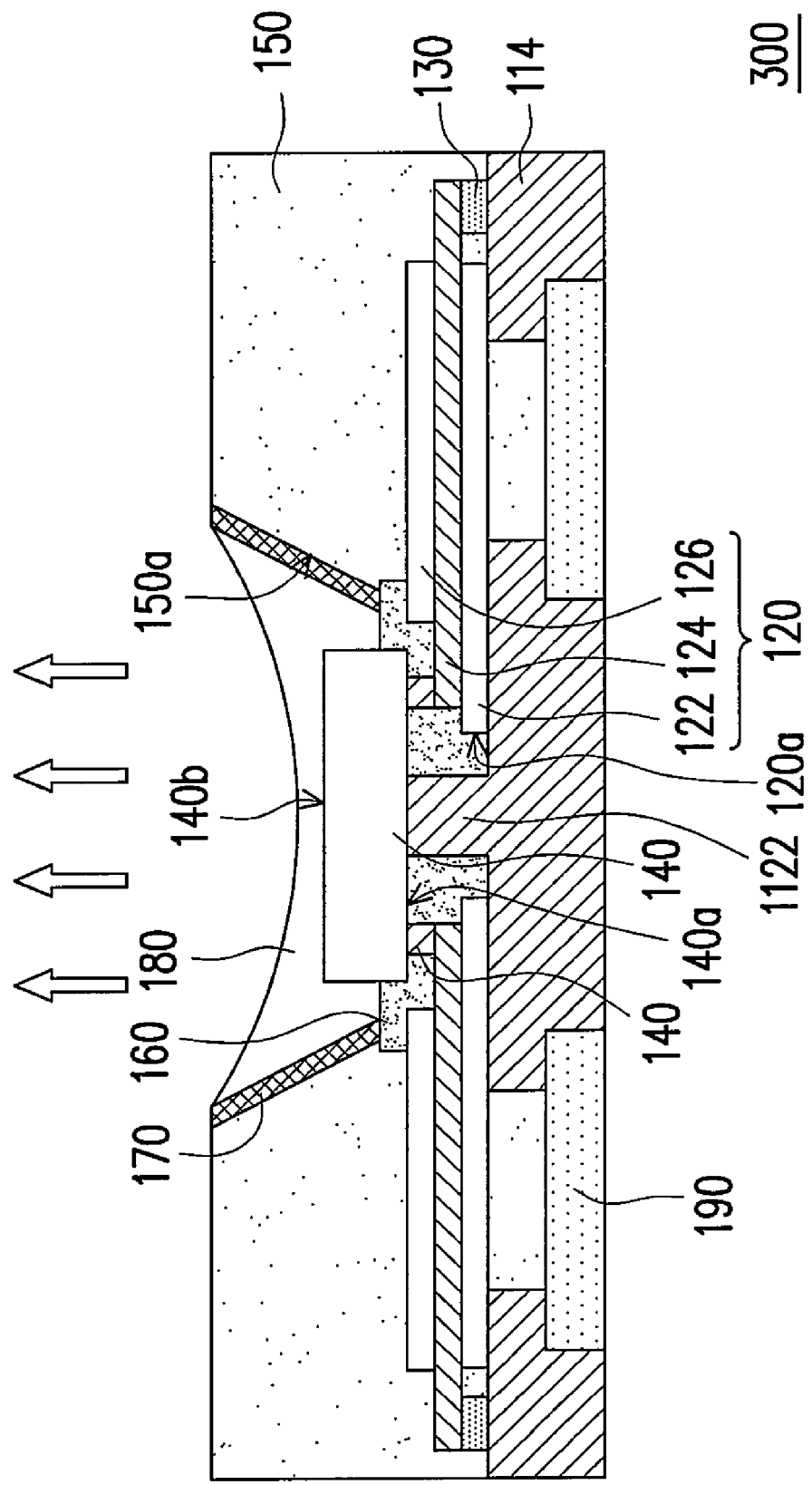
FIG. 4 is a cross-sectional view of a chip package according to a second embodiment of the present invention.

FIG. 4 is a cross-sectional view of a chip package according to a second embodiment of the present invention. Referring to FIG. 4, the present embodiment is similar to the first embodiment, and the difference lies in that a chip package 300 further includes a third molding 190 sandwiched between the contacts 114 and the thermal enhanced plate 112 and disposed under the first molding 150 according to the present embodiment. Moreover, a diameter of the third molding 190 sandwiched between the contacts 114 and the thermal enhanced plate 112 exceeds the diameter of the first molding 150 sandwiched between the contacts 114 and the thermal enhanced plate 112. However, the diameter of the third molding 190 sandwiched between the contacts 114 and the thermal enhanced plate 112 may also be less than or equal to the diameter of the first molding 150 sandwiched between the contacts 114 and the thermal enhanced plate 112 according to other embodiments.

To improve heat dissipation efficiency, the thermal enhanced plate 112 may have a protrusion 1122 which passes through the second opening 120a and is bonded to the chip 140. Furthermore, a heat dissipation adhesive (not shown) may also be disposed between the protrusion 1122 and the chip 140. Besides, the thermal enhanced plate 112 having the protrusion 1122 can also be applied to the first embodiment. A manufacturing method of the chip package 300 will be elaborated hereinafter.

Figure 5E:
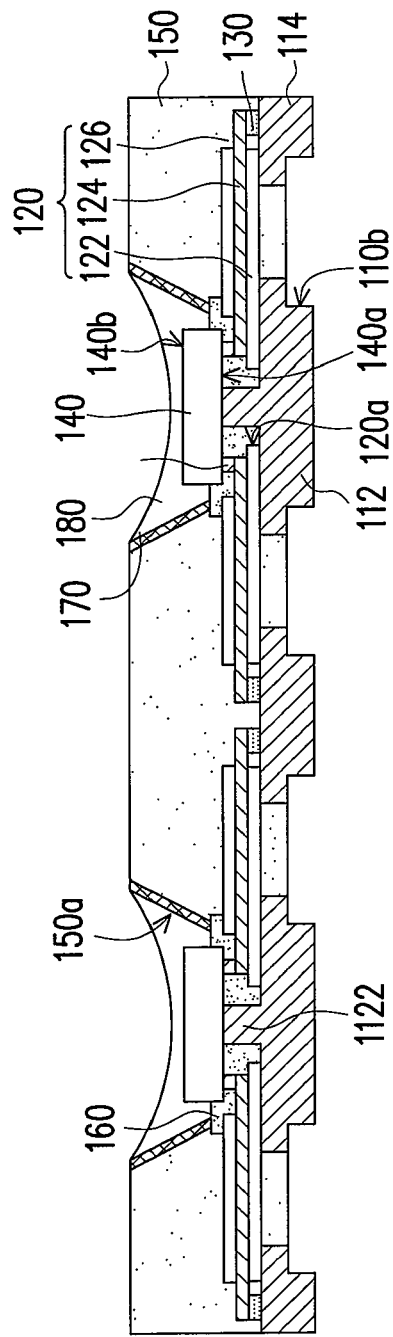

FIGS. 5A through 5G are cross-sectional schematic views showing a manufacturing method of the chip package according to the second embodiment of the present invention. Referring to FIG. 5A, the manufacturing method of the chip package in the present embodiment is similar to that in the first embodiment, and the difference lies in that the heat dissipation portion 112a of the patterned metal plate 110 has the protrusion 1122 in the present embodiment. Except said difference, the formation of the patterned metal plate 110 is similar to that illustrated in FIG. 2A.

With reference to FIG. 5B which is similar to FIG. 2B, the conductive adhesive layer 130 is formed, and the film-like circuit layer 120 is bonded to the patterned metal plate 110.

With reference to FIG. 5C which is similar to FIG. 2C, the chip 140 is disposed on the film-like circuit layer 120, and the underfill 160 is formed. Likewise, the formation of the underfill 160 is not required in the present embodiment.

Please refer to FIG. 5D which is similar to FIG. 2D. The first molding 150 and the reflective layer 170 are formed according to FIG. 5D. Likewise, the formation of the reflective layer 170 is not required in the present embodiment.

With reference to FIG. 5E which is similar to FIG. 2E, the second molding 180 is formed. Similarly, the formation of the second molding 180 is not required in the present embodiment. In addition, in FIG. 2F, a portion of a thickness of the patterned metal plate 110 is removed to expose the first molding 150 in the recesses 110a. Accordingly, the thermal enhanced plate 112 can be electrically insulated from the contacts 114. Nevertheless, according to the present embodiment, a plurality of third openings 110b is formed in the patterned metal plate 110 to expose the first molding 150 in the recesses 110a. Here, the thermal enhanced plate 112 is also electrically insulated from the contacts 114. Besides, the third openings 110b are formed by performing a laser-drilled process or a half-cut process, for example.

Figure 5F:
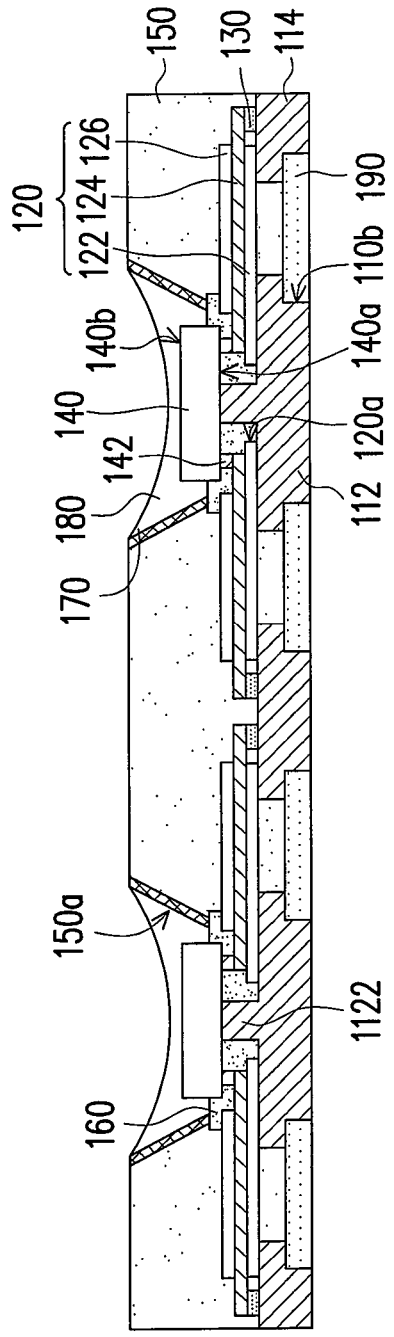

Referring to FIG. 5F, a third molding 190 is formed to fill the third openings 110b.

Figure 5G:
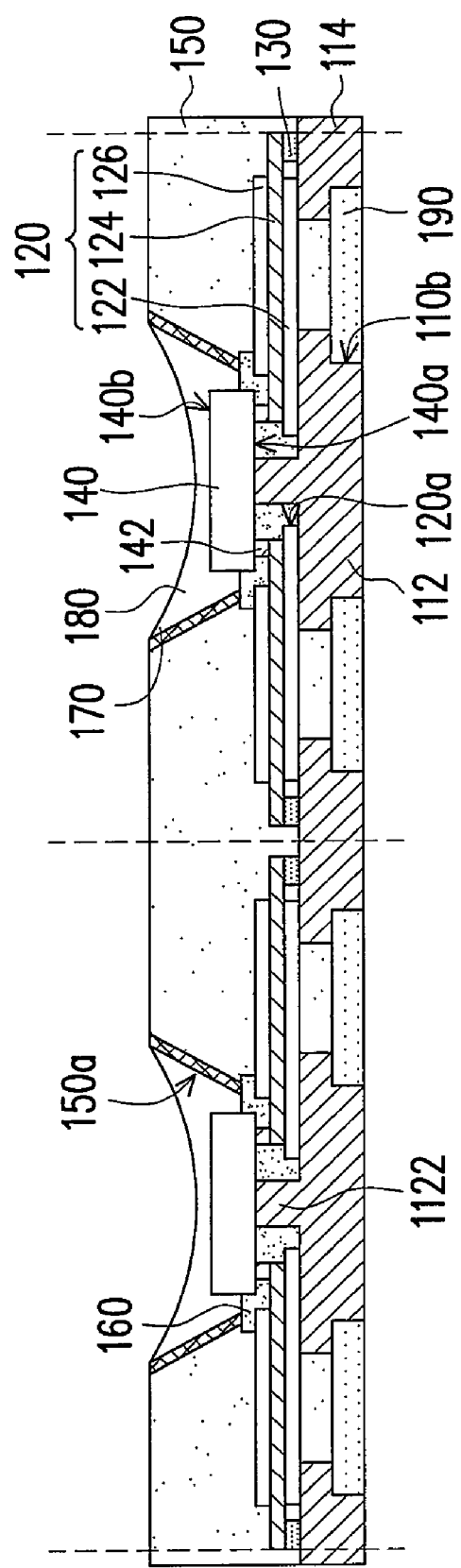

Referring to FIGS. 5F and 5G, a cutting process is eternally performed to form at least one chip package 300. Thus far, the fabrication of the chip package 300 is completed.

Third Embodiment

Figure 6:
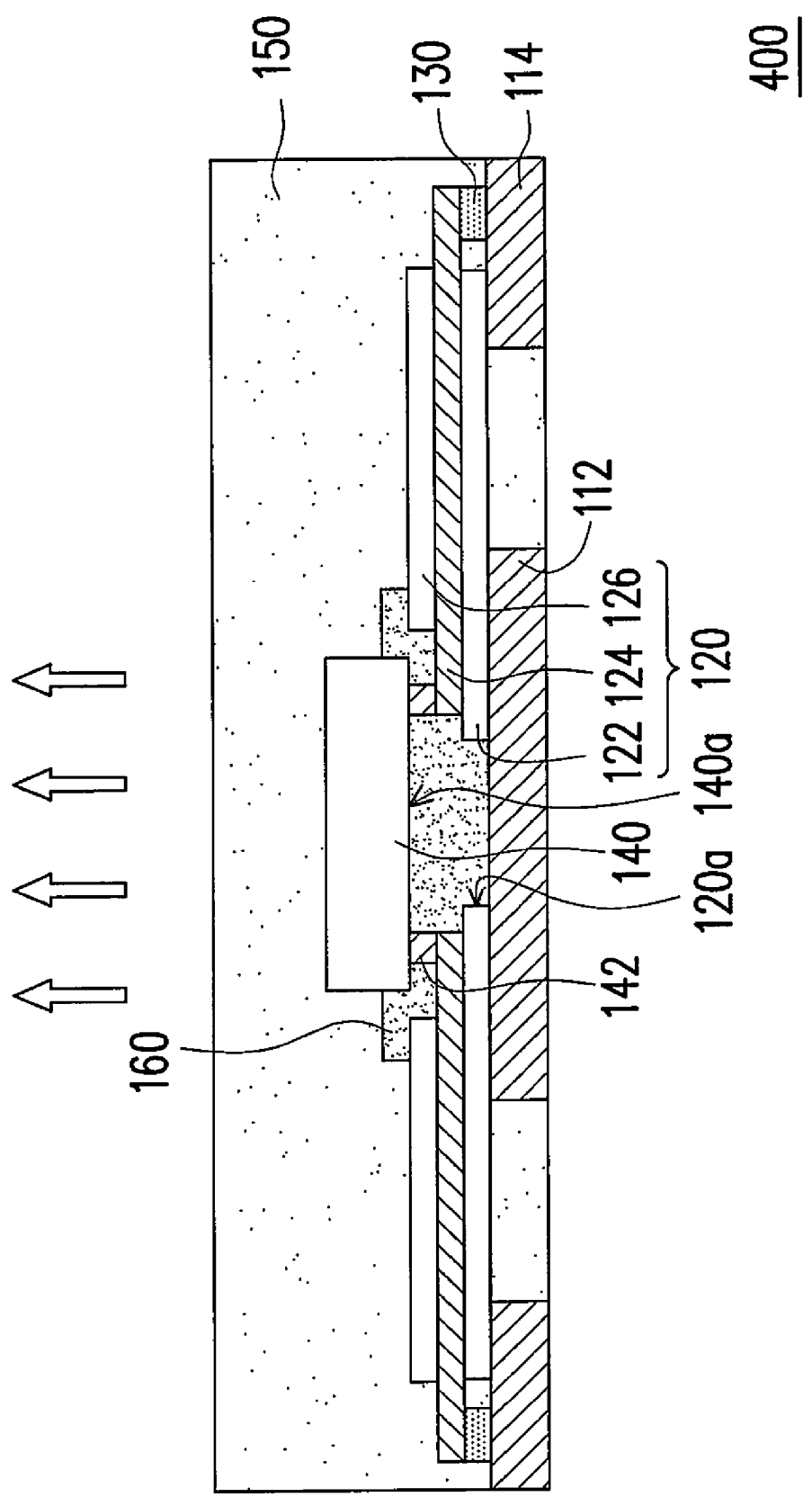
FIG. 6 is a cross-sectional view of a chip package according to a third embodiment of the present invention.

FIG. 6 is a cross-sectional view of a chip package according to a third embodiment of the present invention. Referring to FIG. 6, the present embodiment is similar to the first embodiment, and the difference lies in that the first molding 150 completely encapsulates the chip 140 in a chip package 400 according to the present embodiment. Here, the chip 140 may be a light emitting chip, a memory chip or any other type of chip. The light emitting chip includes an LED chip or an OLED chip. As the chip 140 is the light emitting chip, the first molding 150 is made of a transparent material. By contrast, as the chip 140 is the memory chip or any other types of the chips, the material of the first molding 150 is not limited to the transparent material.

The chip package 400 adopts the thermal enhanced plate 112 as a carrier, and thus the chip package 400 has better heat dissipation efficiency in comparison with the chip package provided by the related art. In addition, since the chip package 400 has the exposed contacts 114, it can replace a conventional quad flat no-lead (QFN) package. Two manufacturing methods of the chip package 400 will be described in detail as follows.

FIGS. 7A through 7E are cross-sectional schematic views showing a manufacturing method of the chip package according to the third embodiment of the present invention. Please refer to FIGS. 7A to 7B which are similar to FIGS. 2A to 2B.

Further, with reference to FIG. 7C which is similar to FIG. 2C, the chip 140 is disposed on the film-like circuit layer 120, and the underfill 160 is formed. Likewise, the formation of the underfill 160 is not required in the present embodiment.

Please refer to FIG. 7D which is similar to FIG. 2D. The difference therebetween lies in that the first molding 150 formed in the present embodiment encapsulates the chip 140, and the formation of the reflective layer 170 is not necessary.

Figure 7A:
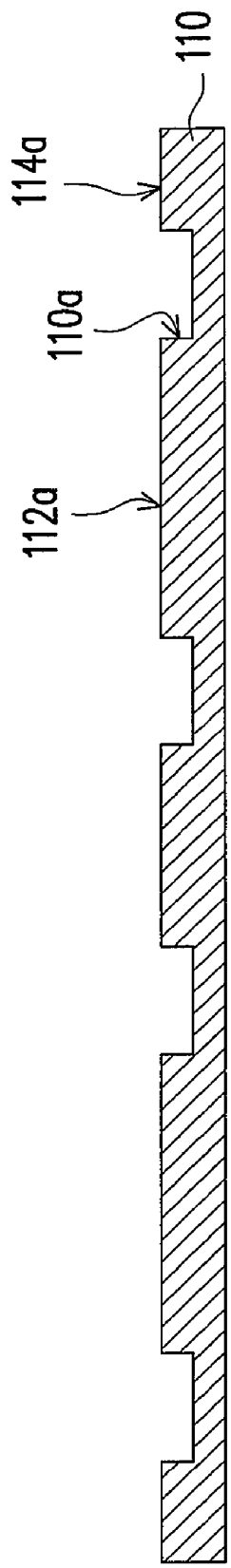
Figure 7B:
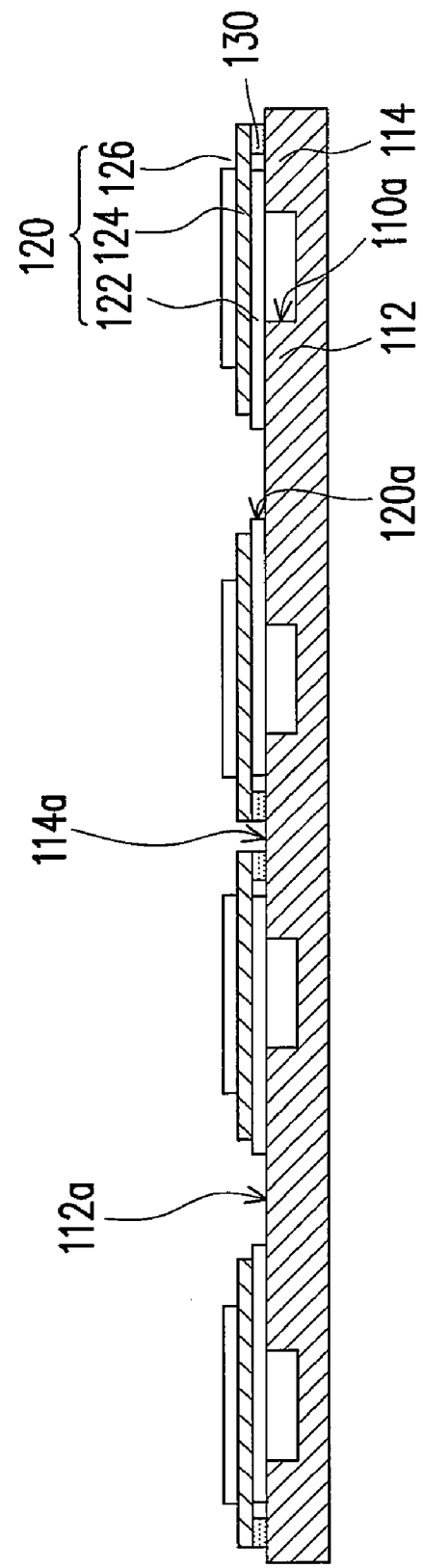
Figure 7E:
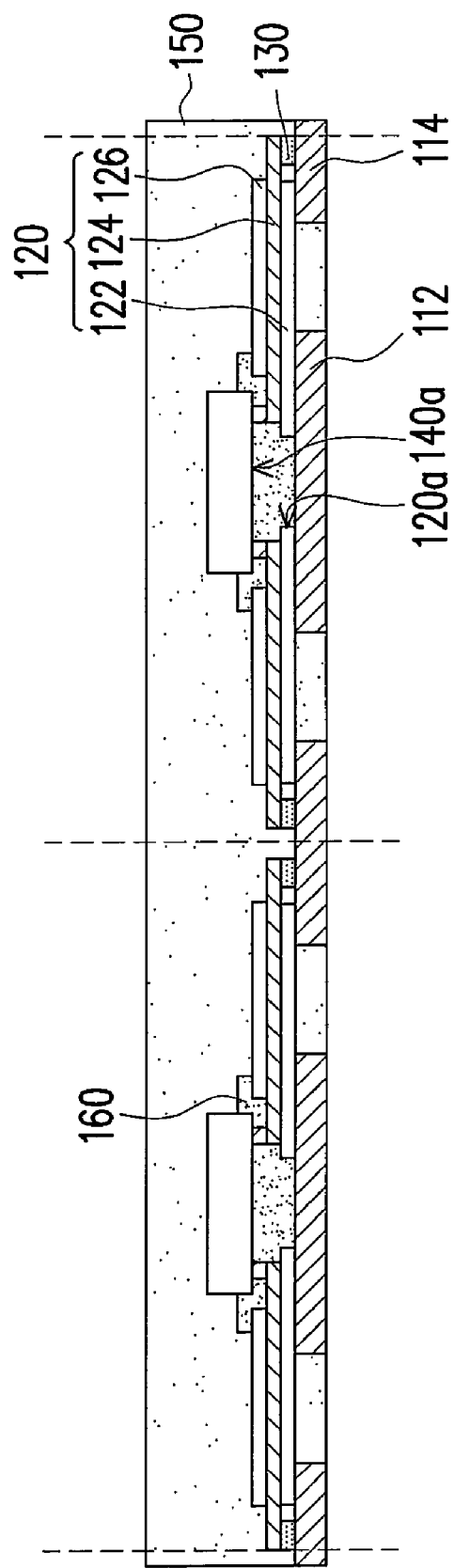

Please refer to FIG. 7E which is similar to FIG. 2F. A portion of the patterned metal plate 110 is removed to expose the first molding 150 in the recesses 110a. Besides, the formation of the second molding 180 is not necessary either.

Eternally, a cutting process is performed to form at least one chip package 400. Thus far, the fabrication of the chip package 400 is completed. In addition to the forgoing, another manufacturing method of the chip package 400 will be elaborated hereinafter.

FIGS. 8A through 8E are cross-sectional schematic views showing another manufacturing method of the chip package according to the third embodiment of the present invention. Please refer to FIGS. 8A to 8B which are similar to FIGS. 3A to 3B.

Figure 8C:
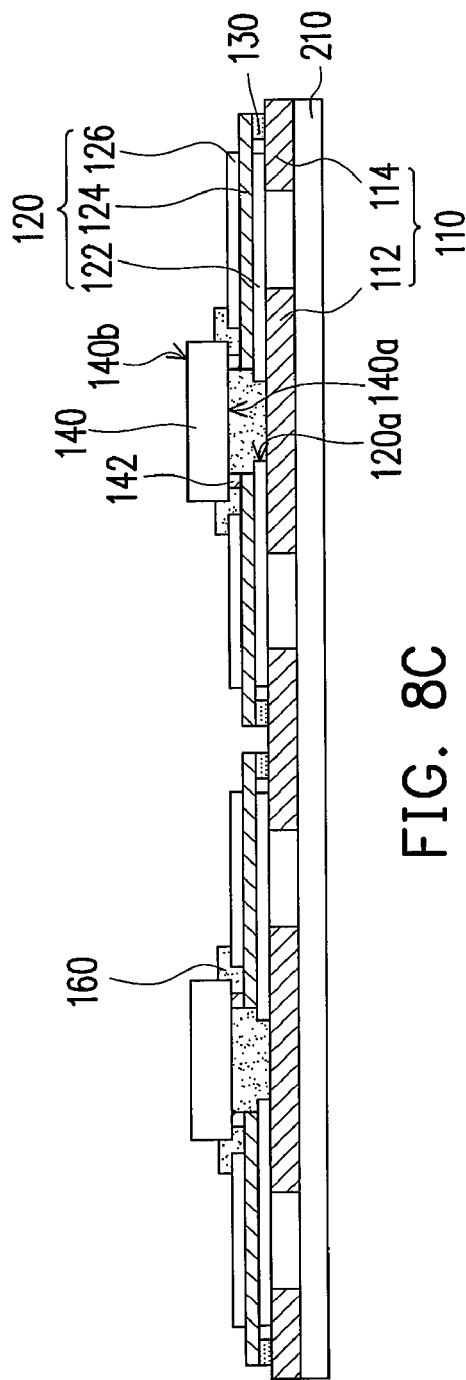

Further, please refer to FIG. 8C which is similar to FIG. 3C. The chip 140 is disposed on the film-like circuit layer 120, and the underfill 160 is formed according to FIG. 8C. Likewise, the formation of the underfill 160 is not required in the present embodiment.

Figure 8D:
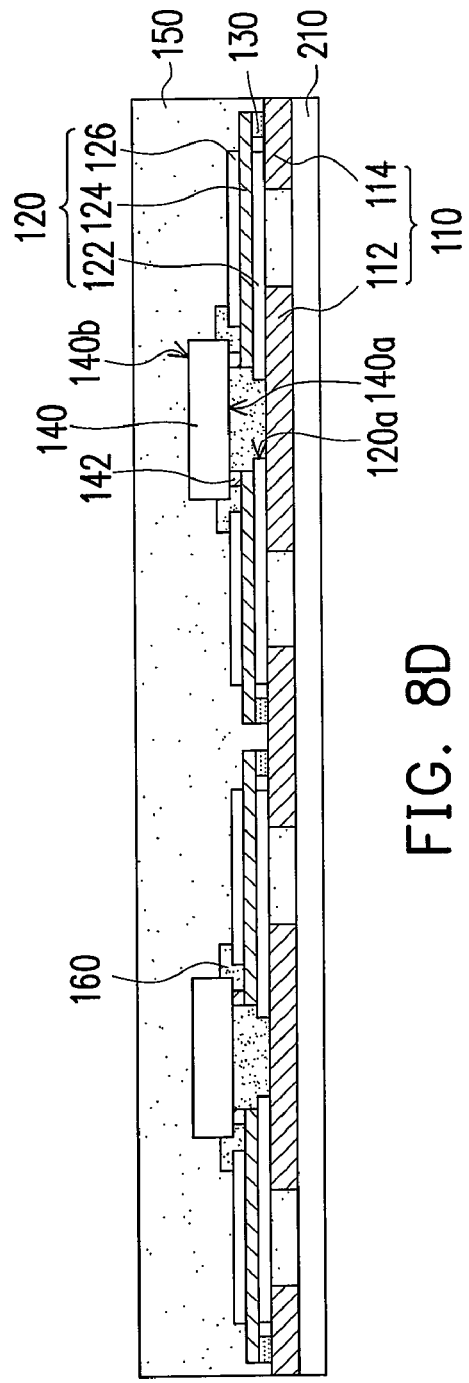

Please refer to FIG. 8D which is similar to FIG. 3D. The difference therebetween lies in that the first molding 150 formed in the present embodiment encapsulates the chip 140, and the formation of the reflective layer 180 is not necessary.

Figure 8E:
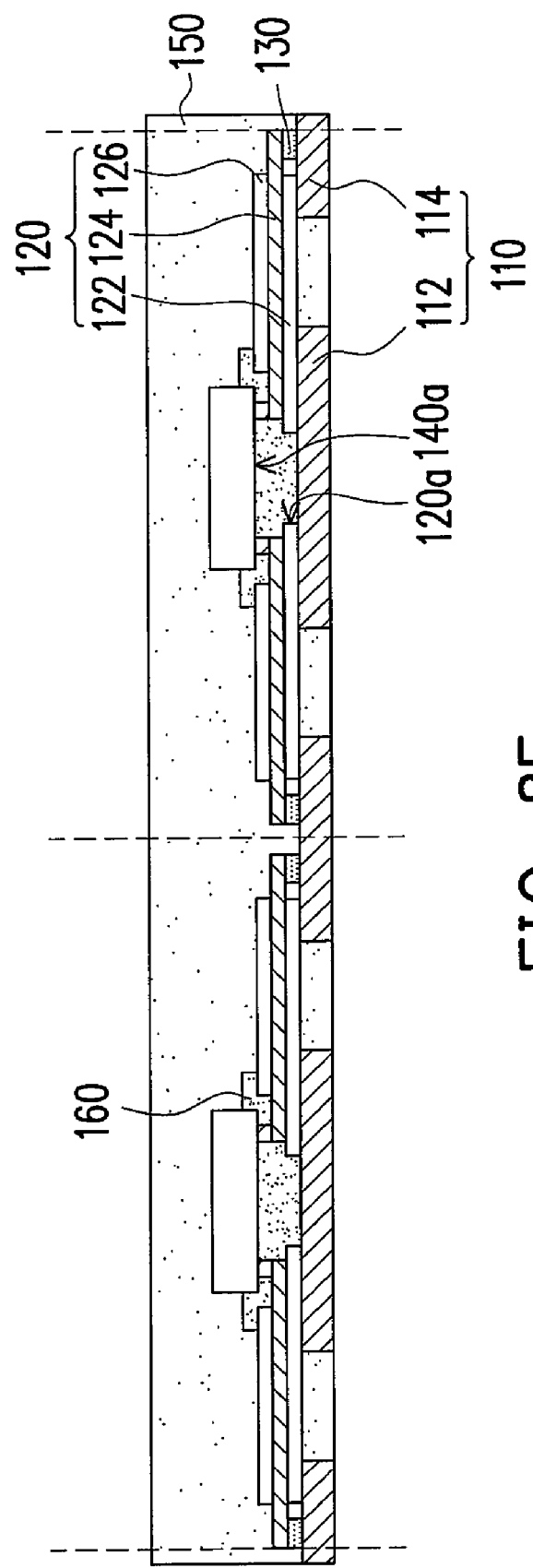

Please refer to FIG. 8E which is similar to FIG. 3F. The substrate 210 is removed to expose the first molding 150 disposed between the thermal enhanced plate 112 and the contacts 114. Besides, the formation of the second molding 180 is not necessary either. Eternally, a cutting process is performed to form at least one chip package 400. Thus far, the fabrication of the chip package 400 is completed.

Fourth Embodiment

Figure 9:
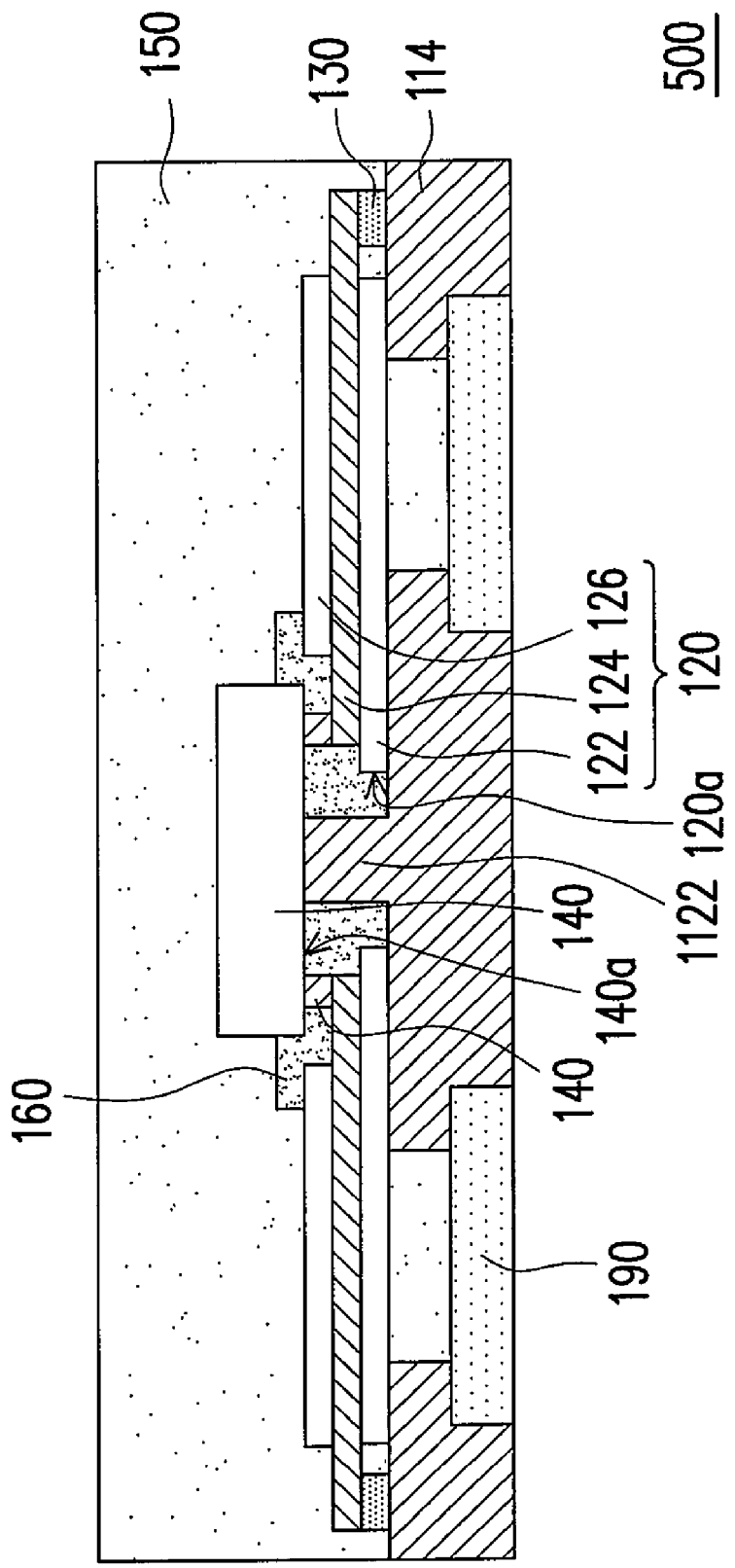
FIG. 9 is a cross-sectional view of a chip package according to a fourth embodiment of the present invention.

FIG. 9 is a cross-sectional view of a chip package according to a fourth embodiment of the present invention. Referring to FIG. 9, the present embodiment is similar to the second embodiment, and the difference lies in that the first molding 150 completely encapsulates the chip 140 in a chip package 500 according to the present embodiment. Here, the chip 140 may be a light emitting chip, a memory chip or any other type of chip. The light emitting chip includes an LED chip or an OLED chip. As the chip 140 is the light emitting chip, the first molding 150 is made of a transparent material. By contrast, as the chip 140 is the memory chip or any other type of chip, the material of the first molding 150 is not limited to the transparent material. In addition, it is not required in the present embodiment that the thermal enhanced plate 112 includes a protrusion 1122. A manufacturing method of the chip package 500 will be elaborated hereinafter.

FIGS. 10A through 10G are cross-sectional schematic views showing a manufacturing method of the chip package according to the fourth embodiment of the present invention. Please refer to FIGS. 10A to 10B which are similar to FIGS. 5A to 5B.

Figure 10C:
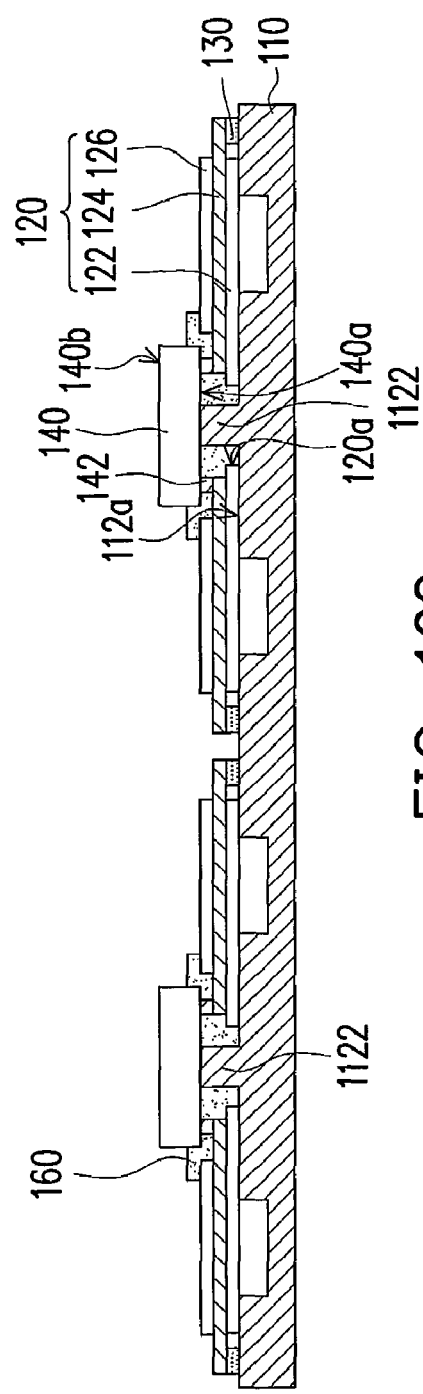

Further, please refer to FIG. 10C which is similar to FIG. 5C. The chip 140 is disposed on the film-like circuit layer 120, and the underfill 160 is formed according to FIG. 10C. Likewise, the formation of the underfill 160 is not required in the present embodiment.

Figure 10D:
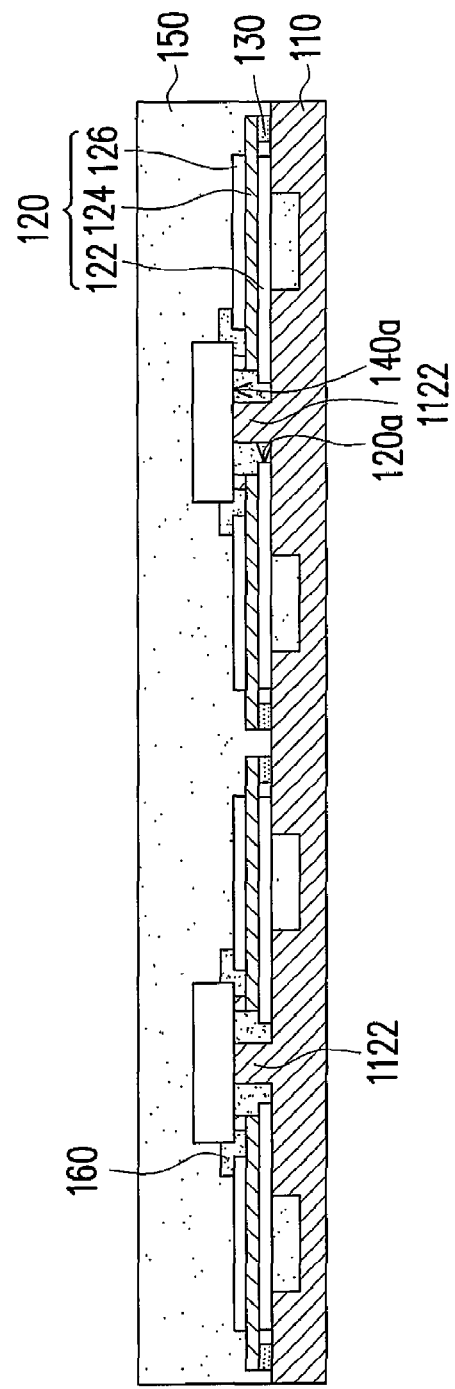

Please refer to FIG. 10D which is similar to FIG. 5D. The difference therebetween lies in that the first molding 150 formed in the present embodiment encapsulates the chip 140, and the formation of the reflective layer 180 is not necessary.

Please refer to FIG. 10E which is similar to FIG. 5E. A portion of the patterned metal plate 110 is removed to form the third openings 110b. Besides, the formation of the second molding 180 is not necessary either.

Referring to FIG. 10F which is similar to FIG. 5F, the third molding 190 is formed in the third openings 110b.

Figure 10G:
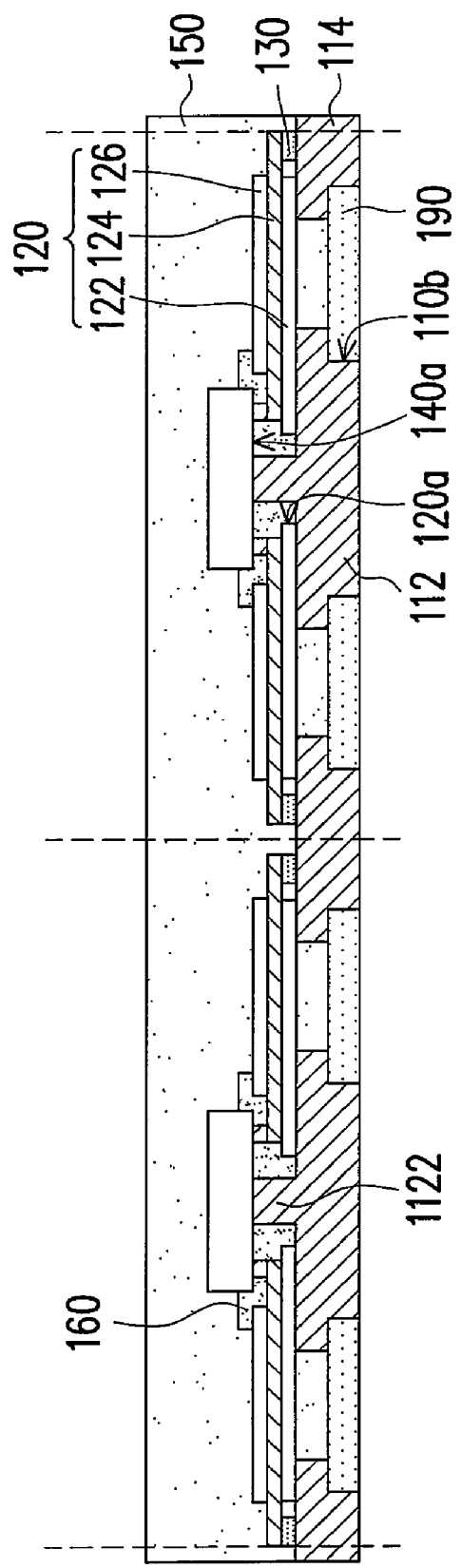

Referring to FIGS. 10F and 10G, a cutting process is eternally performed to form at least one chip package 500. Thus far, the fabrication of the chip package 500 is completed.

In summary, the chip package and the manufacturing method thereof as provided in the present invention have at least the following advantages:

The film-like circuit layer and the substrate with high thermal conductivity are bonded together in the present invention. Thereby, heat generated during the operation of the chip can be conducted to the outside, increasing the service life of the chip and improving light emission efficiency thereof.

The contacts of the chip package are disposed at the bottom or at the side of the chip package according to the present invention. Therefore, the chip package can be assembled to other electronic devices via a surface mounting technology (SMT) or a plug-in/plug-out process.

The chip is electrically connected to the film-like circuit layer through a flip chip bonding process. Accordingly, when the chip is the light emitting chip, the light irradiated thereby is relatively not apt to suffer from the interference caused by other components.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A manufacturing method of a chip package, comprising:
   providing a patterned metal plate having at least a heat dissipation portion, a plurality of contacting portions, and a plurality of recesses, wherein the recesses separate the heat dissipation portion from the contacting portions, and the heat dissipation portion is disposed among the contacting portions;
   forming a conductive adhesive layer on the contacting portions;
   bonding the patterned metal plate to a film-like circuit layer, wherein the film-like circuit layer is electrically connected to the contacting portions through the conductive adhesive layer;
   disposing at least a chip on the film-like circuit layer, wherein the chip has a plurality of bumps, and the chip and the film-like circuit layer are electrically connected through the bumps;
   forming a first molding on the patterned metal plate to encapsulate at least a portion of the film-like circuit layer, wherein the first molding fills the recesses;
   removing a portion of the patterned metal plate to expose the first molding in the recesses and to form at least a thermal enhanced plate and a plurality of contacts separated therefrom; and
   performing a cutting process to form at least a chip package.

2. The manufacturing method of the chip package as claimed in claim 1, wherein the first molding encapsulates the chip in the step of forming the first molding.

3. The manufacturing method of the chip package as claimed in claim 1, wherein the first molding has a first opening exposing the chip in the step of forming the first molding.

4. A manufacturing method of a chip package, comprising:
bonding a patterned metal plate to a substrate, wherein the patterned metal plate comprises at least a thermal enhanced plate and a plurality of contacts around the thermal enhanced plate;
forming a conductive adhesive layer on the contacts;
bonding the patterned metal plate to a film-like circuit layer, wherein the film-like circuit layer is electrically connected to the contacts through the conductive adhesive layer;
disposing at least a chip on the film-like circuit layer, wherein the chip has a plurality of bumps, and the chip and the film-like circuit layer are electrically connected through the bumps;
forming a first molding on the patterned metal plate to encapsulate at least a portion of the film-like circuit layer, a portion of the thermal enhanced plate and parts of the contacts;
removing the substrate; and
performing a cutting process to form at least a chip package.

5. The manufacturing method of the chip package as claimed in claim 4, wherein the first molding encapsulates the chip in the step of forming the first molding.

6. The manufacturing method of the chip package as claimed in claim 4, wherein the first molding has a first opening exposing the chip in the step of forming the first molding.

7. The manufacturing method of the chip package as claimed in claim 6, further comprising forming a second molding on the film-like circuit layer exposed by the first molding to encapsulate the chip after the chip is disposed.

\* \* \* \* \*